(12) United States Patent
Leipold et al.

(10) Patent No.: US 10,298,196 B2
(45) Date of Patent: May 21, 2019

(54) RF FILTERING CIRCUITRY

(71) Applicant: RF Micro Devices, Inc., Greensboro, NC (US)

(72) Inventors: Dirk Robert Walter Leipold, San Jose, CA (US); George Maxim, Saratoga, CA (US); Marcus Granger-Jones, Scotts Valley, CA (US); Baker Scott, San Jose, CA (US)

(73) Assignee: Qorvo US, Inc., Greensboro, NC (US)

( * ) Notice: Subject to any disclaimer, the term of this patent is extended or adjusted under 35 U.S.C. 154(b) by 179 days.

(21) Appl. No.: 15/141,283

(22) Filed: Apr. 28, 2016

(65) Prior Publication Data

US 2017/0033760 A1 Feb. 2, 2017

Related U.S. Application Data

(60) Provisional application No. 62/197,664, filed on Jul. 28, 2015.

(51) Int. Cl.
*H03H 7/01* (2006.01)
*H03H 7/09* (2006.01)

(52) U.S. Cl.
CPC ........ *H03H 7/1775* (2013.01); *H03H 7/0115* (2013.01); *H03H 7/0161* (2013.01); *H03H 7/09* (2013.01); *H03H 2007/013* (2013.01)

(58) Field of Classification Search
CPC ...... H03H 7/09; H03H 7/0115; H03H 7/0161; H03H 7/1775
USPC .................................................. 333/175, 176
See application file for complete search history.

(56) References Cited

U.S. PATENT DOCUMENTS

| | | | | |
|---|---|---|---|---|
| 3,889,214 A | * | 6/1975 | Petitjean | H03J 3/185 333/203 |
| 5,023,866 A | * | 6/1991 | De Muro | H01P 1/2056 333/126 |
| 2008/0204166 A1 | * | 8/2008 | Shafer | H03H 7/0115 333/176 |
| 2011/0072064 A1 | * | 3/2011 | Wei | G06F 3/023 708/300 |
| 2015/0061791 A1 | * | 3/2015 | Imamura | H03H 7/09 333/185 |

OTHER PUBLICATIONS

Mutual Inductance; http://www.electronics-tutorials.ws/inductor/mutual-inductance.html; Oct. 11, 2009.*

* cited by examiner

*Primary Examiner* — Rakesh B Patel
(74) *Attorney, Agent, or Firm* — Withrow & Terranova, P.L.L.C.

(57) ABSTRACT

Embodiments of radio frequency (RF) filtering circuitry are disclosed. In one embodiment, the RF filtering circuitry includes a first port, a second port, a first RF filter path, and a second RF filter path. The first RF filter path is connected between the first port and the second port and includes at least a pair of weakly coupled resonators. The weakly coupled resonators are configured such that a first transfer response between the first port and the second port defines a first passband. The second RF filter path is coupled to the first RF filter path and is configured such that the first transfer response between the first port and the second port defines a stopband adjacent to the first passband without substantially increasing ripple variation of the first passband defined by the first transfer response.

13 Claims, 12 Drawing Sheets

RF FILTERING CIRCUITRY

RELATED APPLICATIONS

This application claims the benefit of provisional patent application Ser. No. 62/197,664, filed Jul. 28, 2015, the disclosure of which is hereby incorporated herein by reference in its entirety.

FIELD OF THE DISCLOSURE

This disclosure relates generally to radio frequency (RF) filtering circuitry and methods of operating the same.

BACKGROUND

Radio frequency (RF) filtering circuitry often includes multiple RF filter paths each providing different passbands tuned within different RF communication bands so that RF signals operating within the different RF communication bands can be routed to the appropriate downstream circuitry. In order to prevent RF filter paths having passbands tuned to adjacent RF communication bands from interfering with one another (particularly when RF communication bands are close to one another) the roll-off of the passband often needs to be increased so as to increase out of band rejection. This is typically done by using filtering components that create a notch adjacent to the passband thereby increasing the roll-off of the passband and out of band rejection. Unfortunately, typical techniques (such as LC notch filters) for creating these notches typically load the RF filter paths within their respective passbands and can create notches with excessive flyback. By increasing the load of the RF filter paths within their respective passbands, ripple variation in the passbands is increased. Thus, the impedance within the passbands varies presenting power transfer inefficiencies and insertion losses. Furthermore, the excessive flyback of the notches can introduce interference from other RF communication bands adjacent to the stopband. Thus, it is desirable to provide RF filtering circuitry that can increase out of band rejection with reduced flyback and without significantly increasing ripple variation in the passband.

SUMMARY

Embodiments of radio frequency (RF) filtering circuitry are disclosed. In one embodiment, the RF filtering circuitry includes a first port, a second port, a first RF filter path, and a second RF filter path. The first RF filter path is connected between the first port and the second port and includes at least a pair of weakly coupled resonators. The weakly coupled resonators are configured such that a first transfer response between the first port and the second port defines a first passband. The second RF filter path is coupled to the first RF filter path and is configured such that the first transfer response between the first port and the second port defines a stopband adjacent to the first passband without substantially increasing ripple variation of the first passband defined by the first transfer response.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
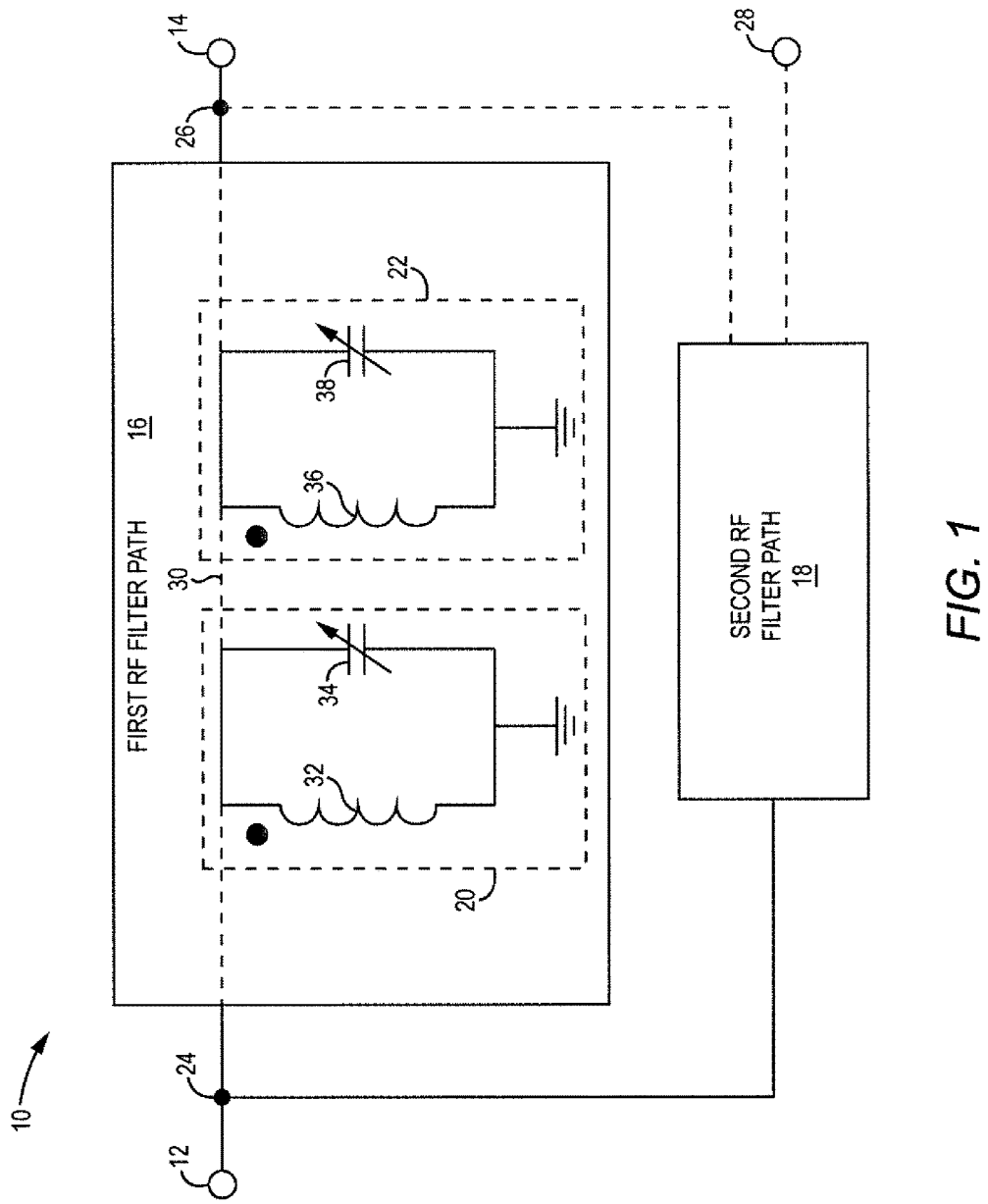
FIG. 1 illustrates exemplary radio frequency (RF) filtering circuitry 10 having a first RF filter path that defines a first passband in a first transfer function between a first port and a second port and a second RF filter path coupled to the first RF filter path and providing a stopband in the first transfer function adjacent to the first passband.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It should be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It should also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It should be understood that, although the terms "upper," "lower," "bottom," "intermediate," "middle," "top," and the like may be used herein to describe various elements, these elements should not be limited by these terms. These terms are only used to distinguish one element from another. For example, a first element could be termed an "upper" element and, similarly, a second element could be termed an "upper" element depending on the relative orientations of these elements, without departing from the scope of the present disclosure.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Throughout this disclosure, relative terminology, such as "approximately," "substantially," "significantly" and the like, may be used in a predicate to describe features and relationships between features of a device or method. The relative terminology in the predicate should be interpreted sensu lato. However, whether the predicate employing the relative terminology is satisfied is determined in accordance to error ranges and/or variation tolerances relevant to the predicate and prescribed to the device or method by RF communication standards relevant to the RF application(s) employing the device or method. For example, the particular RF application employing the device or method may be designed to operate in accordance with certain communication standards, specifications, or the like. These communication standards and specification may prescribe the error ranges and/or variation tolerances relevant to the predicate or may describe performance parameters relevant to the predicate from which the error ranges and/or variation tolerances for the device or method can be deduced and/or inferred.

With regard to the term "port," a port refers to any component or set of components configured to input and/or output RF signals. To illustrate, a port may be provided as a node, pin, terminal, contact, connection pad, and/or the like or a set of the aforementioned components. For example, with regard to a single-ended signal, a port may be provided by a single node or a single terminal. However, in other embodiments for a differential signal, a port may be provided by a pair of terminals or nodes configured to receive and/or transmit differential signals.

Throughout this disclosure, "weakly coupled" and/or "weak coupling" shall mean that a coupling coefficient between coupled components is within a range of approximately 0.0001 to approximately 0.4. Weak magnetic coupling or weak inductive coupling refers to a magnetic coupling coefficient within the aforementioned range, while weak electric coupling or weak capacitive coupling refers to an electric coupling coefficient within the aforementioned range.

Unless otherwise defined, all terms (including technical and scientific terms) used herein have the same meaning as commonly understood by one of ordinary skill in the art to which this disclosure belongs. It will be further understood that terms used herein should be interpreted as having meanings that are consistent with their meanings in the context of this specification and the relevant art and will not be interpreted in an idealized or overly formal sense unless expressly so defined herein.

This disclosure relates generally to radio frequency (RF) filtering circuitry having multiple RF filter paths. Although the specific embodiments described herein describe two RF filter paths and their relationships, the principles described herein are applicable to RF filtering circuitry having any number of RF filter paths. Embodiments of the RF filtering circuitry described herein have a first RF filter path connected between a first port and a second port. The first RF filter path has at least a pair of weakly coupled resonators that are configured to define a first passband in the first transfer function between the first port and the second port. To increase out of band rejection and the shape factor of the first passband, a second RF filter path is coupled to the first RF filter path and configured to provide a stopband in the first transfer function adjacent to the first passband. However, the second RF filter path is configured so as to not significantly load the first RF filter path within the first passband. Accordingly, ripple variation of the first passband defined the first transfer response is not significantly increased by the creation of the stopband and the introduction of the second RF filter path.

FIG. 1 illustrates exemplary RF filtering circuitry 10. The RF filtering circuitry 10 includes a first port 12, a second port 14, a first RF filter path 16, and a second RF filter path 18. The first RF filter path 16 is connected between the first port 12 and the second port 14. The first RF filter path 16 has at least a pair of weakly coupled resonators 20, 22. In the illustrated embodiment, the first RF filter path 16 just has the two weakly coupled resonators 20, 22. However, alternative embodiments of the first RF filter path 16 may include any number of weakly coupled resonators in addition to the weakly coupled resonators 20, 22.

The RF filtering circuitry 10 provides a first transfer response between the first port 12 and the second port 14. The weakly coupled resonators 20, 22 in the first RF filter path 16 are configured such that the first transfer response defines a first passband. In this manner, RF signals that operate in frequency ranges with the first passband propagate through the first RF filter path 16 between the first port 12 and the second port 14. The second RF filter path 18 is coupled to the first RF filter path 16. However, the second RF filter path 18 is configured to define the stopband within the first passband of the first transfer response without substantially increasing ripple variation of the first passband defined by the first transfer response. Accordingly, although the second RF filter path 18 is coupled to the first RF filter path 16, the first passband of the first transfer response between the first port 12 and the second port 14 is not substantially affected by the second RF filter path 18. Thus, the second RF filter path 18 is sufficiently isolated from the weakly coupled resonators 20, 22 so that interaction between the second RF filter path 18 and the weakly coupled resonators 20, 22 does not increase variation within the first passband. More specifically, loading of the first RF filter path 16 by the second RF filter path 18 is so low that substantial rippling is not substantially created or substantially increased by the second RF filter path 18. Thus, insertion losses introduced by the second RF filter path 18 between the first port 12 and the second port 14 are relatively small and constant within the first passband of the first transfer response. Nevertheless, by providing the stopband adjacent to the first passband of the first transfer response, the second RF filter path 18 sharpens the first passband by increasing roll off of the first passband to the stopband.

In FIG. 1, the second RF filter path 18 is illustrated in two exemplary arrangements with respect to the first RF filter path 16. In one exemplary arrangement, the second RF filter path 18 is also connected between the first port 12 and the second port 14. Thus, the second RF filter path 18 is connected in parallel to the first RF filter path 16 with respect to the first port 12 and the second port 14. More specifically, the first RF filter path 16 is connected to a connection node 24 and to a connection node 26. The connection node 24 is connected to the first port 12, and the connection node 26 is connected to the second port 14. In the first exemplary arrangement, the second RF filter path 18 is also connected to the connection node 24 and to the connection node 26 so as to be in parallel with the first RF filter path. Additionally, in this exemplary arrangement, the second RF filter path 18 is configured to dissipate RF signals within the stopband of the first filter response and thereby prevent RF signals with the stopband from propagating between the first port 12 and the second port 14 or through the first RF filter path 16. Dissipating the RF signals usually moderates the depth of the stopband and reduces flyback, thereby ensuring more isolation with respect to the first passband and RF communication bands outside the stopband.

In a second exemplary arrangement, the second RF filter path 18 is coupled between the first port 12 and a third port 28. (It should be noted that alternative embodiments of the second RF filter path 18 may be connected between the second port 14 and the third port 28.) More specifically, the second RF filter path 18 is connected to the connection node 24 and the third port 28. In this second exemplary arrangement, the RF filtering circuitry 10 defines a second transfer response between the first port 12 and the third port 28. With regard to this second exemplary arrangement, the second RF filter path 18 is configured so that the second transfer response defines a second passband that is adjacent to the first passband of the first transfer response. As such, RF signals within the second passband propagate through the second RF filter path 18 between the first port 12 and the third port 28. Therefore, RF signals within the second passband are prevented from propagating through the first RF filter path 16 between the first port 12 and the second port 14. Accordingly, the second RF filter path 18 defines the stopband in the first transfer response between the first port 12 and the second port 14 by defining the second passband in the second transfer response between the first port 12 and the third port 28. By defining the second passband in the second transfer response between the first port 12 and the third port 28, the second RF filter path 18 diverts RF signals within the second passband and thus creates the stopband within the first transfer response.

As shown in FIG. 1, the first RF filter path 16 has a main branch 30 that extends from the connection node 24 to the second port 14. The first RF filter path 16 also includes sub-branches coming off the main branch 30. As explained in further detail below, the filtering components in the main branch 30 and in the sub-branches coming off the main branch provide the desired response characteristics of the first RF filter path 16. To provide the roll-off necessary to create the first passband within the first transfer response between the first port 12 and the second port 14, the RF filtering circuitry 10 provides the parallel resonator 20 and the parallel resonator 22 both connected in shunt with respect to the first RF filter path 16. The parallel resonator 20 shown in FIG. 1 includes an inductor 32 and a capacitive element 34 connected in parallel. The inductor 32 and the capacitive element 34 thereby form the parallel resonator 20. In this embodiment, the inductor 32 and the capacitive element 34 are both connected in shunt with respect to the main branch 30. Furthermore, the parallel resonator 20 is configured to resonate at a first frequency within the first passband of the first transfer response.

With respect to the parallel resonator 22, the parallel resonator 22 includes an inductor 36 and a capacitive element 38 coupled in parallel. More specifically, the inductor 36 is connected in a shunted subpath from the main branch 30 to ground. The capacitive element 38 is also coupled from the main branch 30 in a shunted path from the main branch 30 to ground. As such, the inductor 36 is coupled in parallel with the capacitive element 38 and in shunt with respect to the first RF filter path 16.

As mentioned above, the parallel resonator 20 and the parallel resonator 22 are weakly coupled to one another. The weak coupling between the parallel resonator 20 and the parallel resonator 22 may be provided through magnetic coupling and/or electric coupling. For example, the inductor 32 of the parallel resonator 20 is magnetically coupled to the inductor 36 of the parallel resonator 22. In addition, a capacitive element (not shown in FIG. 1) may be provided in series within the first RF filter path 16 so as to electrically couple the parallel resonator 20 to the parallel resonator 22. It should be noted that in alternative embodiments, the weak coupling between the parallel resonator 20 and the parallel resonator 22 may be provided only through magnetic coupling, and thus the capacitive element (not shown in FIG. 1) would not be provided. In other alternative embodiments, the weak coupling between the parallel resonator 20 and the parallel resonator 22 is provided through capacitive electrocoupling, and thus the inductor 32 and the inductor 36 in these embodiments would not be magnetically coupled.

Returning to the RF filtering circuitry 10 shown in FIG. 1, the parallel resonator 22 of the first RF filter path 16 is configured to resonate at a second frequency within the first passband of the first transfer response between the first port 12 and the second port 14. Since the parallel resonator 20 and the parallel resonator 22 are weakly coupled, and since the parallel resonator 20 resonates at the first frequency within the first passband and the parallel resonator 22 resonates within the second frequency within the first passband, the first RF filter path 16 is coupled so that the first transfer response between the first port 12 and the second port 14 provides the first passband. Note that since the parallel resonator 20 and the parallel resonator 22 are weakly coupled, the first frequency within the second passband and the second frequency within the first passband are relatively close to one another, and thus the first passband of the first transfer response between the first port 12 and the second port 14 has a relatively high quality factor.

With respect to the second RF filter path 18, the second RF filter path 18 is configured such that the first transfer response between the first port 12 and the second port 14 defines the stopband adjacent to the first passband without substantially increasing ripple variation of the first passband defined by the first transfer response. In the first exemplary arrangement, the second RF filter path 18 is connected between the connection node 24 and the connection node 26 in parallel to the first RF filter path 16. The second RF filter path 18 provides low loading within the first passband while providing the stopband adjacent to the first passband. As explained in further detail below, this can be done with the appropriate selection of components within the first RF filter path 16 and the second RF filter path 18. In the second exemplary arrangement, the second RF filter path 18 is connected between the connection node 24 and the third port 28. In this case, the second RF filter path 18 is configured to define the second passband within the second transfer response between the first port 12 and the third port 28. The second passband is provided adjacent to the first passband and thus creates the stopband in the first transfer response adjacent to the first passband. The second RF filter path 18 provides low loading within the first passband while providing the stopband adjacent to the first passband. This can be done through weak coupling of resonators (not shown in FIG. 1) as explained in further detail below.

Figure 2:
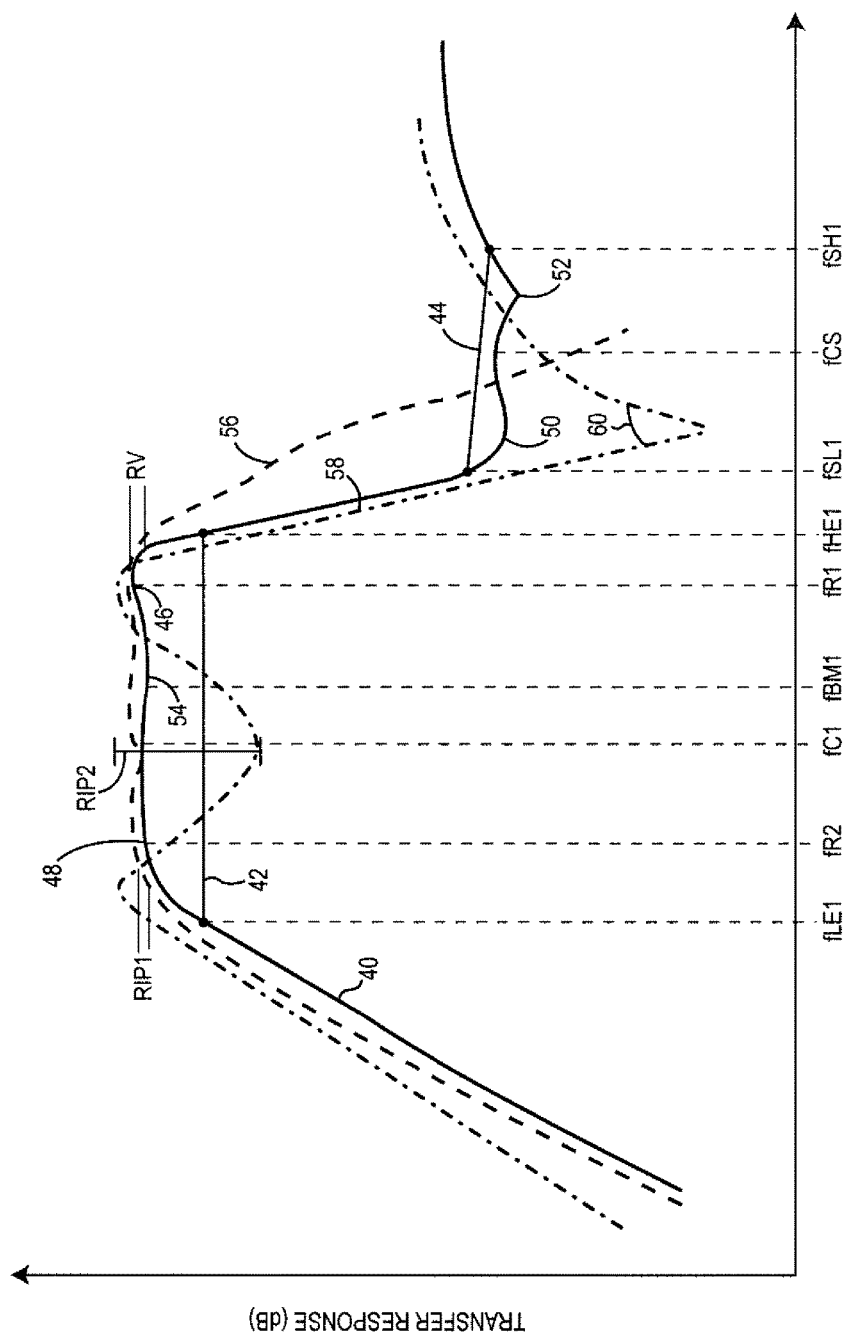
FIG. 2 illustrates one embodiment of the first transfer response of the exemplary RF filtering circuitry shown in FIG. 1.

Referring now to FIGS. 1 and 2, FIG. 2 illustrates one embodiment of a first transfer response 40 between the first port 12 and the second port 14. The first transfer response 40 defines an embodiment of a first passband 42 and a stopband 44. The first passband 42 is defined by a center frequency and by one or more local maxima. More specifically, the first passband 42 is defined by the frequencies at the three dB locations lower than the local maxima or the average of the local maxima. In this case, there are multiple local maxima, and thus the first passband 42 is defined by the three dB locations lower than the average of the local maxima.

In this embodiment, the first passband 42 of the first transfer response 40 has a center frequency fC1, local maxima 46, and local maxima 48. The local maxima 46 is provided by the parallel resonator 20 of the first RF filter path 16 wherein the parallel resonator 20 is configured to resonate at a frequency fR1 where the frequency fR1 provides correspondence to the location of the local maxima 46. The frequency fR1 is within the first passband 42 but greater than the center frequency fC1. The first transfer response 40 also includes another local maxima 48 at the frequency fR2. The frequency fR2 is below the center frequency fC1. The frequency fR2 corresponds to the location of the local maxima 48 where the frequency fR2 is within the first passband 42 of the first transfer response 40. The local maxima 48 is created by the parallel resonator 22 which is configured to resonate at the frequency fR2 within the first passband 42. An average amplitude between the local maxima 46 and the local maxima 48 is determined where a high edge frequency fHE1 of the first passband 42 is at the location of the first transfer response 40 three dB lower than the average peak magnitude and the lower edge frequency fLE1 of the first passband 42 is located at the frequency fLE1, which is three dB lower than the average peak magnitude. The center frequency fC1 is then selected to be the frequency at the center of the first passband 42.

With regard to the stopband 44 of the first transfer response 40, the stopband 44 of the first transfer response 40 is located adjacent to the first passband 42 of the first transfer response 40 due to the second RF filter path 18. The stopband 44 is also defined by taking a minimum or an average between local minima and finding three dB points that are higher than the amplitude of the local minima or average local minima. In this embodiment, the stopband 44 is provided by the average between a local minima 50 and a local minima 52 and finding the three dB points that are higher than the average of the local minima 50, 52. The center frequency fCS is located at a center of the stopband 44. The high edge frequency of the stopband 44 is located at the frequency fSH1 since the first transfer response 40 is three dB higher than the average of the local minima 50, 52 at the frequency fSH1. The low edge frequency of the stopband 44 is located at the frequency fSL1 since the first transfer response 40 is three dB higher than the average of the local minima 50, 52 at the frequency fSL1. The stopband 44 of the first transfer response 40 is created by the second RF filter path 18, shown above with respect to FIG. 1. The stopband 44 is defined by the first transfer response 40 between the first port 12 and the second port 14.

With respect to the first passband 42, the first passband 42 includes the local maxima 46 and the local maxima 48 since the parallel resonator 20 is configured to resonate at the frequency fR1 and the parallel resonator 22 is configured to resonate at the frequency fR2. There are two ripples created in the first passband 42 due to the fact that the first passband 42 is created with the parallel resonator 20 and the parallel resonator 22. It should be noted however that in other embodiments, the first RF filter path 16 may include one or more additional parallel resonant circuits coupled in shunt with respect to the first RF filter path 16. As such, one or more additional local maxima and ripples may be provided in the first passband 42 due to the one or more additional parallel resonant circuits provided in the first RF filter path 16.

The first transfer response 40 has a ripple variation RV that is defined as a difference between the magnitude of the highest of the local maxima 46, 48 and the magnitude of the lowest of local minima within the first passband 42. In this example, the first passband 42 defines two ripples due to the weakly coupled resonators 20, 22 resonating at the resonant frequencies fR1, fR2. Thus, the first passband 42 has only one local minima; the local minima 54 is defined at the frequency fBM1 by the first passband 42. Since the greatest of the local maxima 46, 48 is the local maxima 46, the ripple variation RV of the first passband 42 is defined as the difference in the magnitude of the local maxima 46 and the magnitude of the local minima 54. As shown by FIG. 2, the second RF filter path 18 does not introduce significant loading to the first RF filter path 16. Thus the first passband 42 is relatively flat, and the ripple variation RV is relatively small. The stopband 44 is defined adjacent to the first passband 42 since the stopband 44 is provided by the roll-off in the first transfer response 40 from the first passband 42.

A transfer response 56 is also shown in FIG. 2. The transfer response 56 is based on a counterfactual. More specifically, the transfer response 56 would be the frequency response of the RF filtering circuitry 10 between the first port 12 and the second port 14 if the second RF filter path 18 were not provided and no notch filter where provided to create a stopband adjacent to the passband 42. As can be seen by comparing the first transfer response 40 and the transfer response 56, the second RF filter path 18 does not introduce significant loading within the first passband 42. Nevertheless, the second RF filter path 18 provides the stopband 44 while increasing roll-off. As such, the second RF filter path 18 increases a shape factor of the first passband 42. The transfer response 56 also has a ripple variation RIP1 which is substantially the same as the ripple variation RV. Accordingly, the second RF filter path 18 does not substantially increase the passband ripple within the first passband 42 of the first transfer response 40.

A transfer response 58 is also shown in FIG. 2. The transfer response 58 is also based on a counterfactual. More specifically, the transfer response 58 would be the frequency response of the RF filtering circuitry 10 between the first port 12 and the second port 14 if the second RF filter path 18 were not provided and a notch filter provided a stopband 60. As can be seen by comparing the first transfer response 40 and the transfer response 58, the notch filter introduces significant loading within the first passband 42 in order to provide the stopband 60. As such, a ripple variation RIP2 of the transfer response 58 is much larger than the ripple variation RV and the ripple variation RIP1. Thus, the notch filter significantly increases the ripple variation RIP2. While roll-off increases, the second RF filter path 18 provides the stopband 44, and the stopband 60 has very high flyback, which is shown by comparing the stopband 44 and the stopband 60. As such, the second RF filter path 18 is configured to decrease flyback of the stopband 44. Accordingly, by comparing the first transfer response 40 with the transfer responses 56, 58, FIG. 2 illustrates the advantage of the arrangement illustrated in FIG. 2.

Figure 3:
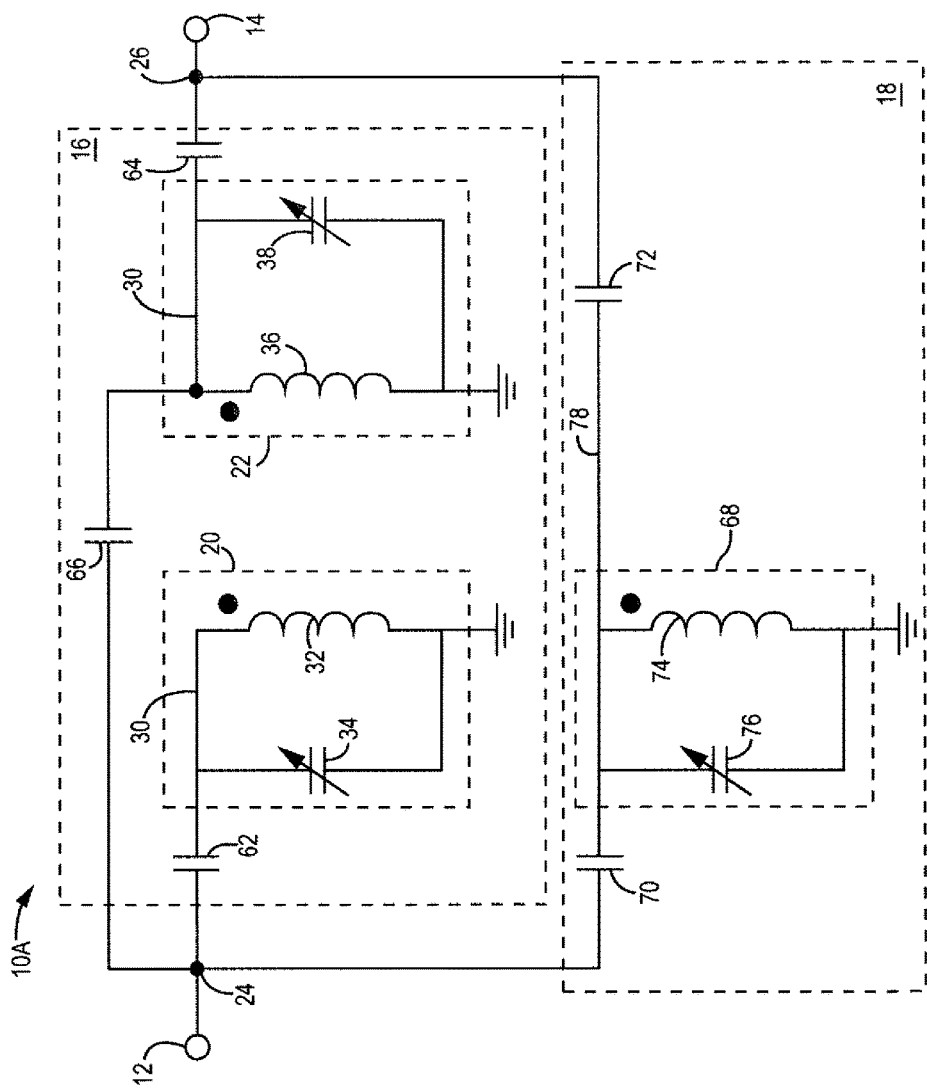
FIG. 3 illustrates one embodiment of the RF filtering circuitry shown in FIG. 1 where the second RF filter path is connected in parallel to the first RF filter path.

Referring now to FIG. 3, FIG. 3 illustrates RF filtering circuitry 10A, which is one embodiment of the RF filtering circuitry 10 shown in FIG. 1. The RF filtering circuitry 10A includes the first port 12, the second port 14, an embodiment of the first RF filter path 16 shown in FIG. 1, and an embodiment of the second RF filter path 18 shown in FIG. 2. As such, the first RF filter path 16 is connected between the first port 12 and the second port 14. The first RF filter path 16 includes the weakly coupled resonators 20, 22 described above with respect to FIG. 1. The weakly coupled resonators 20, 22 are thus configured such that the first transfer response 40 between the first port 12 and the second port 14 defines the first passband 42.

The second RF filter path 18 is coupled to the first RF filter path 16. In this embodiment, the second RF filter path 18 is connected between the first port 12 and the second port 14 by being connected between the connection node 24 and the connection node 26. Thus, the second RF filter path 18 shown in FIG. 3 is in parallel with respect to the first RF filter path 16. As in the embodiment shown in FIG. 1, the second RF filter path 18 shown in FIG. 3 is configured such that the first transfer response 40 between the first port 12 and the second port 14 defines the stopband 44 adjacent to the first passband 42 without substantially increasing ripple variation of the first passband 42 defined by the first transfer response 40.

With regard to the first RF filter path 16 shown in FIG. 3, the first RF filter path 16 also includes a capacitive element 62, a capacitive element 64, and a capacitive element 66. The capacitive element 62 is connected in series within the first RF filter path 16 between the first port 12 and the parallel resonator 20. The capacitive element 64 is connected in series within the first RF filter path 16 between the second port 14 and the parallel resonator 22. The capacitive element 66 is connected in a subpath between the first port 12 and the parallel resonator 22. The capacitive element 66 is utilized to create a notch within the stopband 44, thereby widening the stopband 44, as explained in further detail below.

With regard to the second RF filter path 18 shown in FIG. 3, the second RF filter path 18 also includes a parallel resonator 68, a capacitive element 70 and a capacitive element 72. The capacitive element 70 is connected in series within the second RF filter path 18 between the first port 12 and the parallel resonator 68. The capacitive element 72 is connected in series within the second RF filter path 18 between the parallel resonator 68 and the second port 14.

With respect to the parallel resonator 68, the parallel resonator 68 includes an inductor 74 and a capacitive element 76 coupled in parallel. More specifically, the inductor 74 is connected in a shunted subpath from a main branch 78 of the second RF filter path 18 to ground. The capacitive element 76 is also coupled from the main branch 78 in a shunted path from the main branch 78 to ground. As such, the inductor 74 is coupled in parallel with the capacitive element 76 and in shunt with respect to the second RF filter path 18. The parallel resonator 68 is configured to resonate at a frequency within the stopband 44 of the first transfer response 40. In this manner, the second RF filter path 18 shown in FIG. 3 is configured to provide the stopband 44 adjacent to the first passband 42. To provide dissipation and low loading, the parallel resonator 68 is not weakly coupled to the weakly coupled resonators 20, 22. Thus, the inductor 74 is not magnetically coupled to the inductor 32 and is not magnetically coupled to the inductor 36.

In this embodiment, the second RF filter path 18 is configured to provide dissipation within the stopband 44. As such, an RF signal within the stopband 44 is dissipated by the parallel resonator 68 and cannot pass between the first port 12 and the second port 14. However, the second RF filter path 18 shown in FIG. 3 is configured such that the first transfer response 40 between the first port 12 and the second port 14 defines the stopband 44 adjacent to the first passband 42 without substantially increasing the passband ripple within the first passband 42 of the first transfer response 40. This is done through the configuration of the capacitive elements 62, 64, 70, 72. The configuration of the capacitive elements 62, 64, 70, 72 ensures that there is low loading between the first RF filter path 16 and the second RF filter path 18 within the first passband 42 of the first transfer response 40 while allowing the parallel resonator 68 to dissipate RF signals within the stopband 44. Furthermore, the configuration results in reduced flyback of the stopband 44, thereby isolating the second RF filter path 18 from RF communication bands outside the stopband 44.

With regards to the configuration of the capacitive elements 62, 64, 70, 72 of the RF filtering circuitry 10A shown in FIG. 3, the capacitive element 62 within the first RF filter path 16 has a first capacitance, the capacitive element 64 within the first RF filter path 16 has a second capacitance, the capacitive element 70 within the second RF filter path 18 has a third capacitance, the capacitive element 72 within the second RF filter path 18 has a fourth capacitance. In order to provide low loading and not significantly increase the ripple variation of the first passband 42, the third capacitance of the capacitive element 70 is provided so as to be significantly smaller than the first capacitance of the capacitive element 62. For example, the third capacitance of the capacitive element 70 may be at least 1 order of magnitude smaller than the first capacitance of the capacitive element 62. Additionally or alternatively, the fourth capacitance of the capacitive element 72 is provided so as to be significantly smaller than the second capacitance of the capacitive element 64. For example, the fourth capacitance of the capacitive element 72 may be at least 1 order of magnitude smaller than the second capacitance of the capacitive element 64.

In order to tune the first passband 42 and the stopband 44, the capacitive element 34 of the parallel resonator 20 is configured to provide a first variable capacitance, the capacitive element 38 of the parallel resonator 22 is configured to provide a second variable capacitance, and the capacitive element 76 of the parallel resonator 68 is configured to provide a third variable capacitance. Also, the inductor 32 also has a first inductance, the inductor 36 has a second inductance, and the inductor 74 has a third inductance. To appropriately tune the RF filtering circuitry 10A, the third variable capacitance may be set so as to be significantly smaller than the first variable capacitance and to be significantly smaller than the second variable capacitance. For example, the third variable capacitance may be set to be at least one order of magnitude smaller than the first variable capacitance and to be one order of magnitude smaller than the second variable capacitance. The third inductance of the inductor 74 may also be provided so as to be significantly larger than the first inductance of the inductor 32 and so as to be significantly larger than the second inductance of the inductor 36. For example, the third inductance of the inductor 74 may also be provided so as to be at least one order of magnitude larger than the first inductance of the inductor 32 and so as to be at least one order of magnitude larger than the second inductance of the inductor 36.

Figure 4:
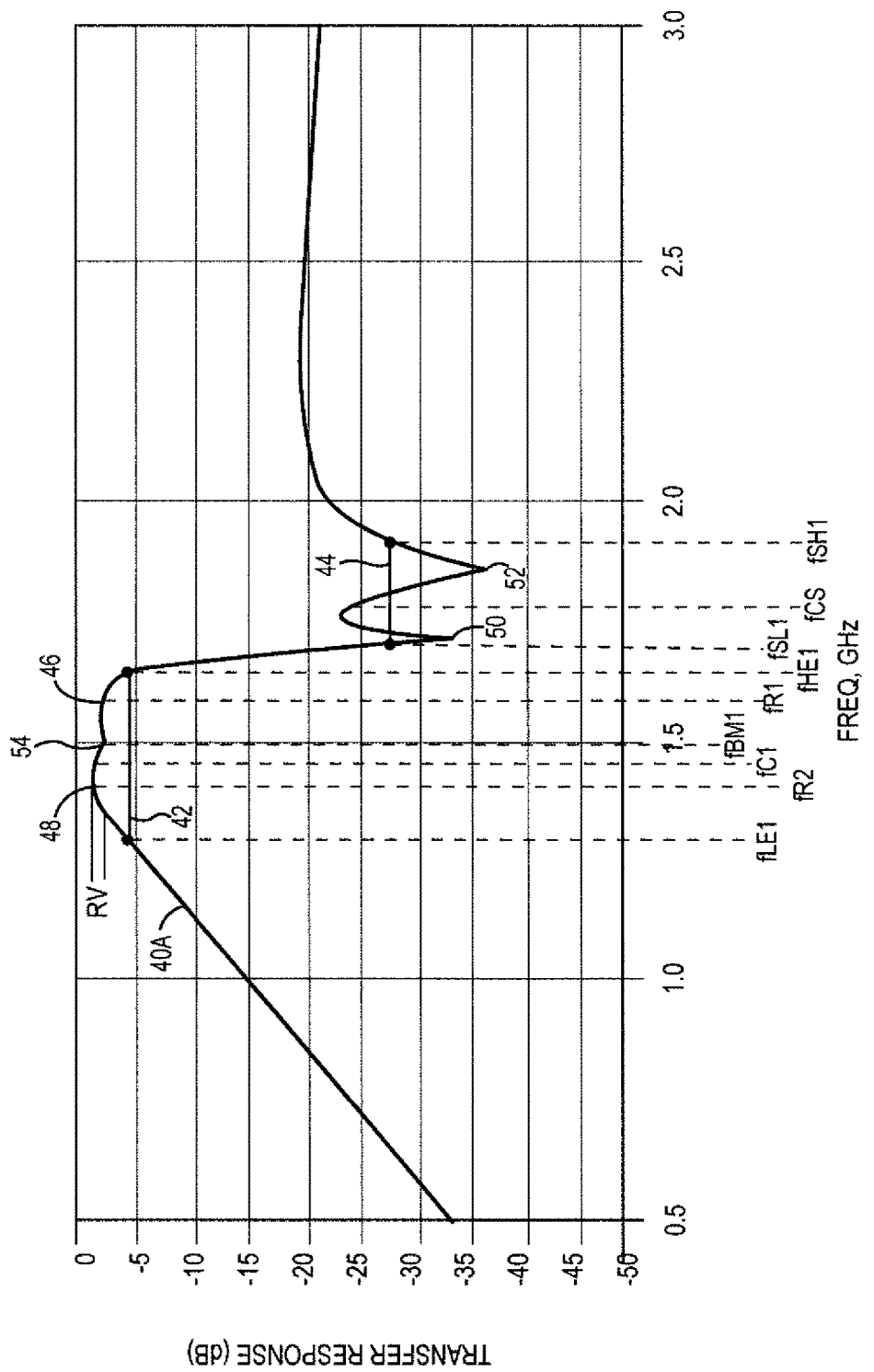
FIG. 4 illustrates one embodiment of the first transfer response of the RF filtering circuitry shown in FIG. 3.

Referring now to FIGS. 3 and 4, FIG. 4 illustrates one embodiment of a first transfer response 40A between the first port 12 and the second port 14 of the RF filtering circuitry 10A shown in FIG. 3. The first transfer response 40A is similar to the first transfer response 40 shown in FIG. 2. The first transfer response 40A defines an embodiment of the first passband 42 and the stopband 44. The first passband 42 of the first transfer response 40A has a center frequency fC1, the local maxima 46, and the local maxima 48. The local maxima 46 is provided by the parallel resonator 20 of the first RF filter path 16 wherein the parallel resonator 20 is configured to resonate at the frequency fR1 where the frequency fR1 provides correspondence to the location of the local maxima 46. The frequency fR1 is within the first passband 42 but greater than the center frequency fC1. The first transfer response 40A also includes the other local maxima 48 at the frequency fR2. The frequency fR2 is below the center frequency fC1. The frequency fR2 corresponds to the location of the local maxima 48 where the frequency fR2 is within the first passband 42 of the first transfer response 40A. The local maxima 48 is created by the parallel resonator 22 which is configured to resonate at the frequency fR2 within the first passband 42.

The stopband 44 of the first transfer response 40A is located adjacent to the first passband 42 of the first transfer response 40A due to the second RF filter path 18. In this embodiment, the stopband 44 is provided by an average between the local minima 50 and the local minima 52 and finding the three dB points that are higher than the average of the local minima 50, 52. The center frequency fCS is located at a center of the stopband 44. The high edge frequency of the stopband 44 is located at the frequency fSH1 since the first transfer response 40A is three dB higher than the average of the local minima 50, 52 at the frequency fSH1. The low edge frequency of the stopband 44 is located at the frequency fSL1 since the first transfer response 40A is three dB higher than the average of the local minima 50, 52 at the frequency fSL1. The stopband 44 of the first transfer response 40A is created by the second RF filter path 18, shown above with respect to FIG. 3. The stopband 44 is defined by the first transfer response 40A between the first port 12 and the second port 14.

With respect to the first transfer response 40A, the first passband 42 includes the local maxima 46 and the local maxima 48 since the parallel resonator 20 is configured to resonate at the frequency fR1 and the parallel resonator 22 is configured to resonate at the frequency fR2. There are two ripples created in the first passband 42 due to the fact that the first passband 42 is created with the parallel resonator 20 and the parallel resonator 22. It should be noted however that in other embodiments, the first RF filter path 16 may include one or more additional parallel resonant circuits coupled in shunt with respect to the first RF filter path 16. As such, one or more additional local maxima and ripples may be provided in the first passband 42 due to the one or more additional parallel resonant circuits provided in the first RF filter path 16.

The first transfer response 40A has the ripple variation RV that is defined as a difference between the magnitude of the highest of the local maxima 46, 48 and the magnitude of the lowest of local minima within the first passband 42. In this example, the first passband 42 defines two ripples due to the weakly coupled resonators 20, 22 resonating at the resonant frequency fR1, fR2. Thus, only one local minima, the local minima 54, is defined at the frequency fBM1 by the first passband 42. Since the greatest of the local maxima 46, 48 is the local maxima 46, the ripple variation RV of the first passband 42 is defined as the difference in the magnitude of the local maxima 46 and the magnitude of the local minima 54. As shown by FIG. 4, the second RF filter path 18 does not introduce significant loading to the first RF filter path 16. Thus, the first passband 42 is relatively flat, and the ripple variation RV is relatively small. The stopband 44 is defined adjacent to the first passband 42 since the stopband 44 is provided by the roll-off in the first transfer response 40A from the first passband 42.

Figure 5:
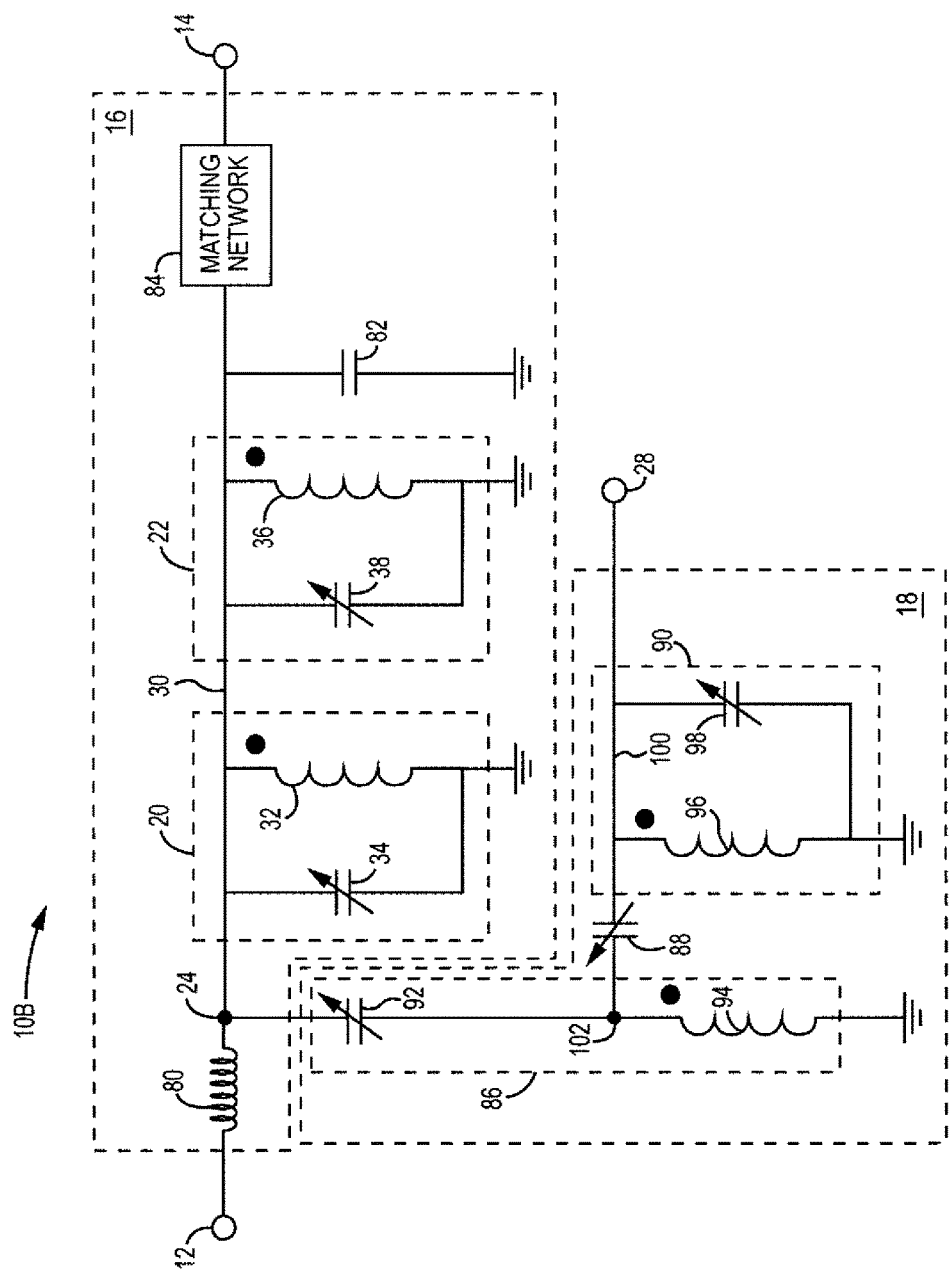
FIG. 5 illustrates another embodiment of the RF filtering circuitry shown in FIG. 1 where the second RF filter path is connected between the first RF filter path and a third port so as to define a second transfer response with a second passband that creates the stopband defined by the first transfer response.

Referring now to FIG. 5, FIG. 5 illustrates RF filtering circuitry 10B, which is one embodiment of the RF filtering circuitry 10 shown in FIG. 1. The RF filtering circuitry 10B includes the first port 12, the second port 14, an embodiment of the first RF filter path 16 shown in FIG. 1, and an embodiment of the second RF filter path 18 shown in FIG. 2. As such, the first RF filter path 16 is connected between the first port 12 and the second port 14. The first RF filter path 16 includes the weakly coupled resonators 20, 22 described above with respect to FIG. 1. The weakly coupled resonators 20, 22 are thus configured such that the first transfer response 40 between the first port 12 and the second port 14 defines the first passband 42.

The second RF filter path 18 is coupled to the first RF filter path 16. In this embodiment, the second RF filter path 18 is connected between the first port 12 and the third port 28 by being connected between the connection node 24 and the third port 28. Thus, the second RF filter path 18 shown in FIG. 5 provides a filter path between the first port 12 and the third port 28. As in the embodiment shown in FIG. 1, the second RF filter path 18 shown in FIG. 5 is configured such that the first transfer response 40 between the first port 12 and the second port 14 defines the stopband 44 adjacent to the first passband 42 without substantially increasing ripple variation of the first passband 42 defined by the first transfer response 40.

With regard to the first RF filter path 16 shown in FIG. 5, the first RF filter path 16 also includes an inductor 80, a capacitive element 82, and a matching network 84. The inductor 80 is coupled in series between the first port 12 and the connection node 24. The capacitive element 82 is connected in shunt within respect to the first RF filter path 16 between the parallel resonator 22 and the matching network 84. The matching network 84 is connected to the second port 14 and is configured to substantially match a source impedance of the RF filter path to a load impedance as seen at the second port 14.

With regard to the second RF filter path 18 shown in FIG. 5, the second RF filter path 18 also includes a series resonator 86, a capacitive element 88 and a parallel resonator 90. With regard to this second exemplary arrangement, the second RF filter path 18 shown in FIG. 5 is configured so that the second transfer response defines a second passband that is adjacent to the first passband 42 of the first transfer response 40. As such, RF signals within the second passband propagate through the second RF filter path 18 between the first port 12 and the third port 28. Therefore, RF signals within the second passband are prevented from propagating through the first RF filter path 16 between the first port 12 and the second port 14. Accordingly, the second RF filter path 18 defines the stopband 44 in the first transfer response 40 between the first port 12 and the second port 14 by defining the second passband in the second transfer response between the first port 12 and the third port 28. By defining the second passband in the second transfer response between the first port 12 and the third port 28, the second RF filter path 18 diverts RF signals within the second passband and thus creates the stopband 44 within the first transfer response 40.

In the embodiment illustrated in FIG. 5, the second RF filter path 18 further includes a series resonator 86 connected in shunt with respect to the first RF filter path 16. More specifically, the series resonator 86 is provided by the second RF filter path 18 so as to be connected in shunt with respect to the main branch 30 of the first RF filter path 16. Thus the series resonator 86 is provided within a shunt path, and the series resonator 86 is connected at the connection node 24 to the first RF filter path 16. In this embodiment, the series resonator 86 includes a capacitive element 92 and an inductor 94 coupled in series within a subpath connected to the main branch 30 at the connection node 24. In this manner, the capacitive element 92 and the inductor 94 form the series resonator 86. The series resonator 86 is configured to resonate at a first frequency within the second passband of the second transfer response defined between the first port 12 and the third port 28.

The parallel resonator 90 shown in FIG. 5 includes an inductor 96 and a capacitive element 98 connected in parallel. In this embodiment, the inductor 96 is connected in shunt with respect to a main branch 100 of the second RF filter path 18. The capacitive element 98 is also connected in shunt with respect to the main branch 100 of the second RF filter path 18. The parallel resonator 90 is also configured to resonate at the first frequency within the second passband of the second transfer response defined between the first port 12 and the third port 28. Thus the series resonator 86 and the parallel resonator 90 are each configured to resonate at substantially the same frequency. The second passband of the second transfer response between the first port 12 and the third port 28 is defined adjacent to the first passband 42 of the first transfer response 40 between the first port 12 and the second port 14. In this manner, the series resonator 86 and the parallel resonator 90 define the stopband 44 in the first transfer response 40 between the first port 12 and the second port 14.

The second RF filter path 18 is configured such that the first transfer response 40 between the first port 12 and the second port 14 defines the stopband 44 adjacent to the first passband 42 without substantially increasing ripple variation of the first passband 42 defined by the first transfer response 40. To do this, the series resonator 86 is weakly coupled to the parallel resonator 90. In this embodiment, the weak coupling between the series resonator 86 and the parallel resonator 90 is provided both through magnetic coupling and electric coupling. More specifically, the inductor 94 of the series resonator 86 is magnetically coupled to the inductor 96 of the parallel resonator 90. In addition, the capacitive element 88 is provided in series within the second RF filter path 18 and connected to series resonator 86 at a connection node 102 between the capacitive element 92 and the inductor 94 of the series resonator 86. It should be noted that in alternative embodiments, the weak coupling between the series resonator 86 and the parallel resonator 90 may be provided only through magnetic coupling, and thus the capacitive element 88 would not be provided. In other alternative embodiments, the weak coupling between the series resonator 86 and the parallel resonator 90 is provided through capacitive electrocoupling, and thus the inductor 94 and the inductor 96 in these embodiments would not be magnetically coupled. Note that in this embodiment, the series resonator 86 and the parallel resonator 90 are not weakly coupled to the parallel resonator 20 and the parallel resonator 22.

Figure 6:
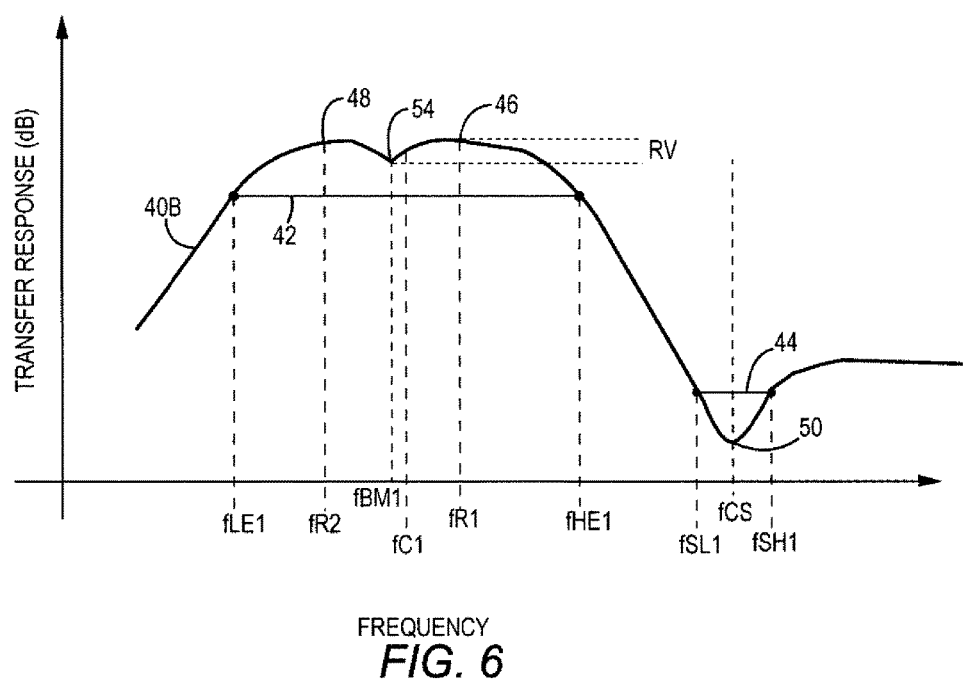
FIG. 6 illustrates one embodiment of the first transfer response of the RF filtering circuitry shown in FIG. 5.

Referring now to FIGS. 5 and 6, FIG. 6 illustrates one embodiment of a first transfer response 40B between the first port 12 and the second port 14 of the RF filtering circuitry 10B shown in FIG. 5. The first transfer response 40B is similar to the first transfer response 40 shown in FIG. 2. The first transfer response 40B defines an embodiment of the first passband 42 and the stopband 44. The first passband 42 of the first transfer response 40B has a center frequency fC1, the local maxima 46, and the local maxima 48. The local maxima 46 is provided by the parallel resonator 20 (shown in FIG. 1) of the first RF filter path 16 wherein the parallel resonator 20 is configured to resonate at the frequency fR1 where the frequency fR1 provides correspondence to the location of the local maxima 46. The frequency fR1 is within the first passband 42 but greater than the center frequency fC1. The first transfer response 40B also includes the other local maxima 48 at the frequency fR2. The frequency fR2 is below the center frequency fC1. The frequency fR2 corresponds to the location of the local maxima 48 where frequency fR2 is within the first passband 42 of the first transfer response 40B. The local maxima 48 is created by the parallel resonator 22 which is configured to resonate at the frequency fR2 within the first passband 42.

The stopband 44 of the first transfer response 40B is located adjacent to the first passband 42 of the first transfer response 40B due to the second RF filter path 18. In this embodiment, the stopband 44 is provided by the local minima 50 finding the three dB points that are higher than the local minima 50. The center frequency fCS is located at a center of the stopband 44. The high edge frequency of the stopband 44 is located at the frequency fSH1 since the first transfer response 40B is three dB higher than the local minima 50 at the frequency fSH1. The low edge frequency of the stopband 44 is located at the frequency fSL1 since the first transfer response 40B is three dB higher than the average of the local minima 50 at the frequency fSL1. The stopband 44 of the first transfer response 40B is created by the second RF filter path 18, shown above with respect to FIG. 5. The stopband 44 is defined by the first transfer response 40B between the first port 12 and the second port 14.

With respect to the first transfer response 40B, the first passband 42 includes the local maxima 46 and the local maxima 48, since the parallel resonator 20 is configured to resonate at the frequency fR1, and the parallel resonator 22 is configured to resonate at the frequency fR2. There are two ripples created in the first passband 42 due to the fact that the first passband 42 is created with the parallel resonator 20 and the parallel resonator 22. It should be noted however that in other embodiments, the first RF filter path 16 may include one or more additional parallel resonant circuits coupled in shunt with respect to the first RF filter path 16. As such, one or more additional local maxima and ripples may be provided in the first passband 42 due to the one or more additional parallel resonant circuits provided in the first RF filter path 16.

The first transfer response 40B has the ripple variation RV that is defined as a difference between the magnitude of the highest of the local maxima 46, 48 and the magnitude of the lowest of the local minima within the first passband 42. In this example, the first passband 42 defines two ripples due to the weakly coupled resonators 20, 22 resonating at the resonant frequency fR1, fR2. Thus, only one local minima, the local minima 54, is defined at the frequency fBM1 by the first passband 42. Since the greatest of the local maxima 46, 48 is the local maxima 46, the ripple variation RV of the first passband 42 is defined as the difference in the magnitude of the local maxima 46 and the magnitude of the local minima 54. As shown by FIG. 6, the second RF filter path 18 does not introduce significant loading to the first RF filter path 16. Thus, the first passband 42 is relatively flat, and the ripple variation RV is relatively small. The stopband 44 is defined adjacent to the first passband 42 since the stopband 44 is provided by the roll-off in the first transfer response 40B from the first passband 42.

Figure 7:
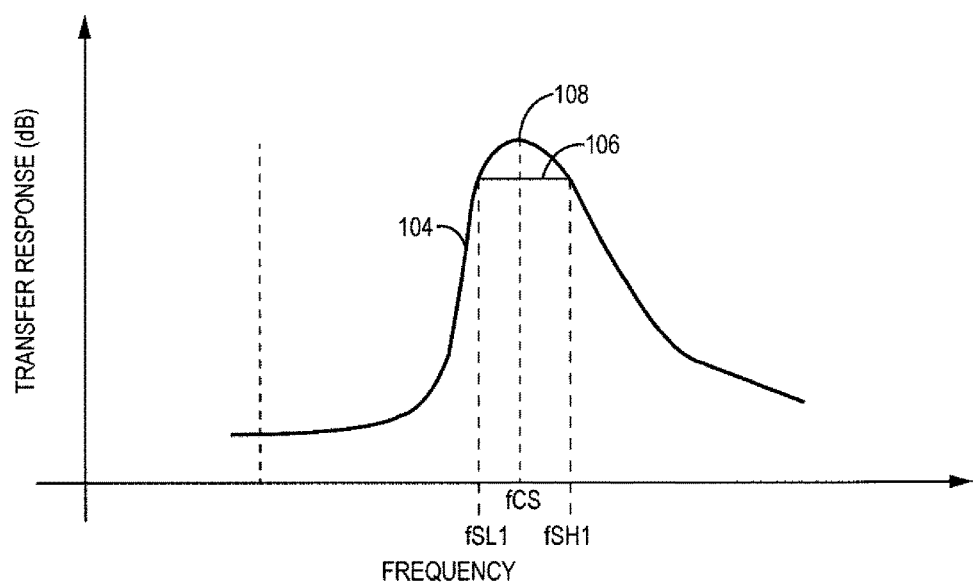
FIG. 7 illustrates one embodiment of the second transfer response of the RF filtering circuitry shown in FIG. 5.

Referring now to FIGS. 5 and 7, FIG. 7 illustrates an embodiment of the second transfer response 104 between the first port 12 and the third port 28 of the RF filtering circuitry 10B shown in FIG. 5. The second transfer response 104 defines a second passband 106. More specifically, the series resonator 86 and the parallel resonator 90 shown in FIG. 5 are each tuned to resonate at the center frequency fCS, which is also the center frequency of the stopband 44 (shown in FIG. 6). The second passband 106 is defined at a local maxima 108 and the frequencies at the three dB locations lower than the local maxima 108. The three dB locations (i.e., the edges of the second passband 106) are located at frequency fSL1 and at frequency fSH1 since the second transfer response 104 is three dB lower than at the local maxima 108 at the frequency fSL1, fSH1. The frequency fSL1 and the frequency fSH1 are the same edge frequencies as that of the stopband 44 (shown in FIG. 6). By defining the second passband 106 of the second transfer response 104 between the first port 12 and the third port 28 adjacent to the first passband 42 (shown in FIG. 6) of the first transfer response 40B (shown in FIG. 6), the second RF filter path 18 shown in FIG. 5 provides the stopband 44 (shown in FIG. 6) in the first transfer response 40B (shown in FIG. 6) adjacent to the first passband 42 (shown in FIG. 6).

Figure 8:
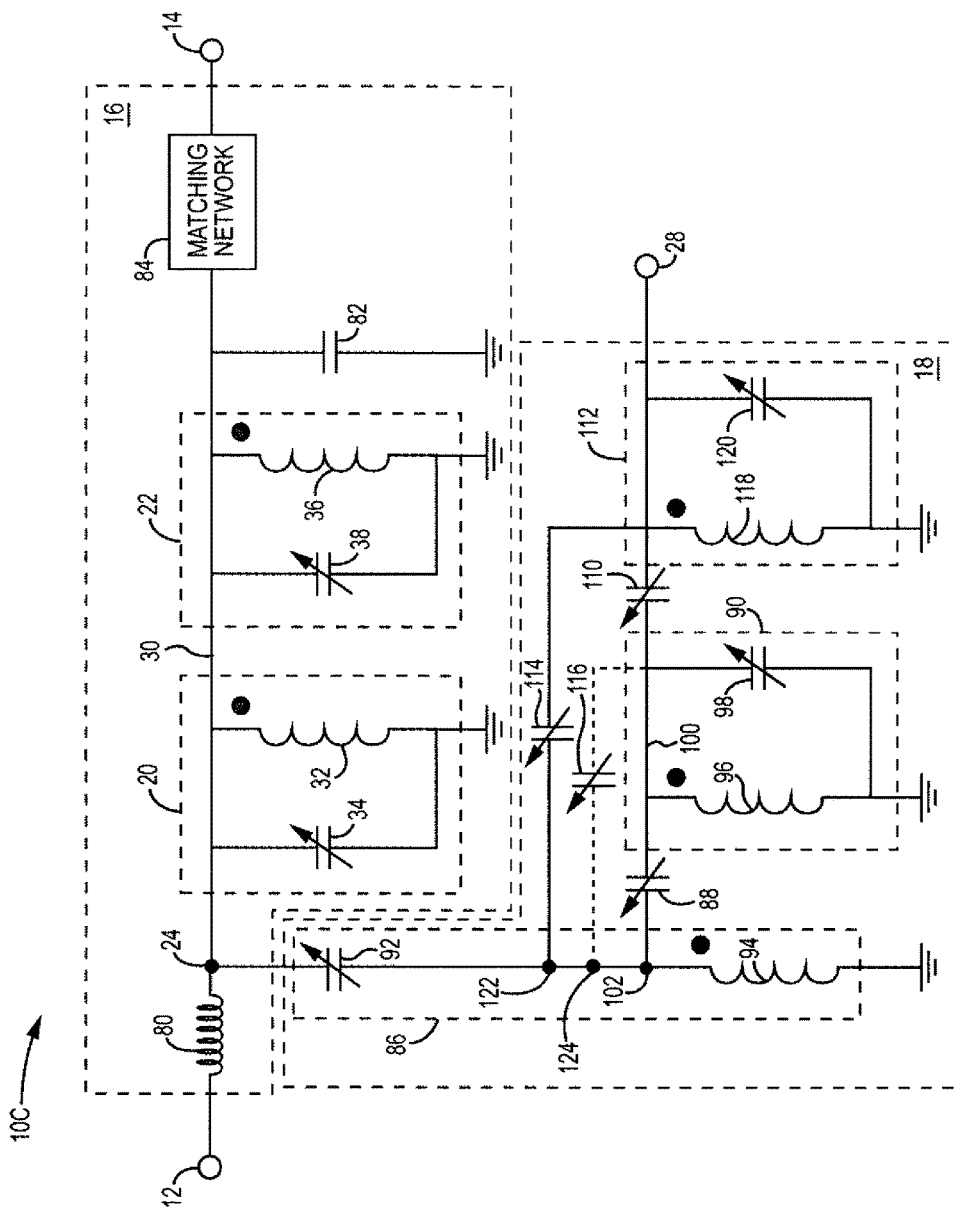
FIG. 8 illustrates another embodiment of the RF filtering circuitry 10 shown in FIG. 1, which is similar to the embodiment shown in FIG. 5, but further includes capacitive elements to provide notches so as to expand the stopband.

Referring now to FIG. 8, FIG. 8 illustrates RF filtering circuitry 10C, which is another embodiment of the RF filtering circuitry 10 shown in FIG. 1. The RF filtering circuitry 10C includes the first port 12, the second port 14, the same embodiment of the first RF filter path 16 shown in FIG. 5, and another embodiment of the second RF filter path 18 shown in FIG. 1. As shown in FIG. 8, the second RF filter path 18 is coupled to the first RF filter path 16. In this embodiment, the second RF filter path 18 is connected between the first port 12 and the third port 28 by being connected between the connection node 24 and the third port 28. Thus, the second RF filter path 18 shown in FIG. 8 provides a filter path between the first port 12 and the third port 28. As in the embodiment shown in FIG. 1, the second RF filter path 18 shown in FIG. 8 is configured such that the first transfer response 40 between the first port 12 and the second port 14 defines the stopband 44 adjacent to the first passband without substantially increasing ripple variation of the first passband defined by the first transfer response 40.

In this embodiment, the second RF filter path 18 shown in FIG. 8 is configured so that the second transfer response 104 defines a second passband 106 that is adjacent to the first passband of the first transfer response 40. As such, RF signals within the second passband 106 propagate through the second RF filter path 18 between the first port 12 and the third port 28. Therefore, RF signals within the second passband 106 are prevented from propagating through the first RF filter path 16 between the first port 12 and the second port 14. Accordingly, the second RF filter path 18 defines the stopband 44 in the first transfer response 40 between the first port 12 and the second port 14 by defining the second passband 106 in the second transfer response 104 between the first port 12 and the third port 28. By defining the second passband 106 in the second transfer response 104 between the first port 12 and the third port 28, the second RF filter path 18 diverts RF signals within the second passband 106, and thus creates the stopband 44 within the first transfer response 40.

The second RF filter path 18 shown in FIG. 8 includes the series resonator 86, the capacitive element 88, and the parallel resonator 90 described above with respect to FIG. 5. Additionally, the second RF filter path 18 shown in FIG. 8 also includes a capacitive element 110, a parallel resonator 112, and a capacitive element 114. A capacitive element 116 is optionally included. The parallel resonator 112 shown in FIG. 8 includes an inductor 118 and a capacitive element 120 connected in parallel. In this embodiment, the inductor 118 is connected in shunt with respect to the main branch 100 of the second RF filter path 18. A capacitive element 120 is also connected in shunt with respect to the main branch 100 of the second RF filter path 18. As in the previous embodiment described in FIG. 5, the series resonator 86 and the parallel resonator 90 are each configured to resonate at substantially the same frequency. The parallel resonator 112 is also configured to resonate at a second frequency within the second passband 106 of the second transfer response 104 defined between the first port 12 and the third port 28. The second passband 106 of the second transfer response 104 between the first port 12 and the third port 28 is defined adjacent to the first passband of the first transfer response 40 between the first port 12 and the second port 14. In this manner, the series resonator 86 and the parallel resonator 112 define the stopband 44 in the first transfer response 40 between the first port 12 and the second port 14.

The second RF filter path 18 is configured such that the first transfer response 40 between the first port 12 and the second port 14 defines the stopband 44 adjacent to the first passband without substantially increasing ripple variation of the first passband defined by the first transfer response 40. To do this, the parallel resonator 90 and the parallel resonator 112 are weakly coupled to one another. In this embodiment, the parallel resonator 90 is connected between the series resonator 86 and the parallel resonator 112. Since the parallel resonator 90 is weakly coupled to the parallel resonator 112, the series resonator 86 is also weakly coupled to the parallel resonator 112.

The parallel resonator 112 is connected between the parallel resonator 90 and the third port 28. The weak coupling between the parallel resonator 90 and the parallel resonator 112 is provided both through magnetic coupling and electric coupling. More specifically, the inductor 96 of the parallel resonator 90 is magnetically coupled to an inductor 118 of the parallel resonator 112. In addition, the capacitive element 110 is provided in series within the second RF filter path 18 and connected between the parallel resonator 90 and the parallel resonator 112 within the main branch 100. It should be noted that in alternative embodiments, the weak coupling between the parallel resonator 90 and the parallel resonator 112 may be provided only through magnetic coupling, and thus the capacitive element 110 would not be provided. In other alternative embodiments, the weak coupling between the parallel resonator 90 and the parallel resonator 112 is provided through capacitive electrocoupling, and thus the inductor 96 and the inductor 118 in these embodiments would not be magnetically coupled. Note that in this embodiment, the series resonator 86, the parallel resonator 90, and the parallel resonator 112 are not weakly coupled to the parallel resonator 20 and the parallel resonator 22.

The capacitive element 114 is connected between a connection node 122 and the parallel resonator 112. The connection node 122 is provided between the capacitive element 92 and the inductor 94 of the series resonator 86. In this manner, the capacitive element 114 may be used to provide additional maxima within the second passband 106 of the second transfer response 104 between the first port 12 and the third port 28. In this manner, the second passband 106 is expanded. As a result, the capacitive element 114 provides an additional minima (or notch) within the stopband 44 of the first transfer response 40 so as to expand the stopband 44.

In one example, the capacitive element 116 shown in FIG. 8 is also connected between a connection node 124 and the parallel resonator 90. The connection node 124 is provided between the capacitive element 92 and the inductor 94 of the series resonator 86. In this manner, the capacitive element 116 may be used to provide still another additional maxima within the second passband 106 of the second transfer response 104 between the first port 12 and the third port 28. In this manner, the second passband 106 is further expanded. As a result, the capacitive element 116 provides still another additional minima (or notch) within the stopband 44 of the first transfer response 40 so as to further expand the stopband 44.

Figure 9:
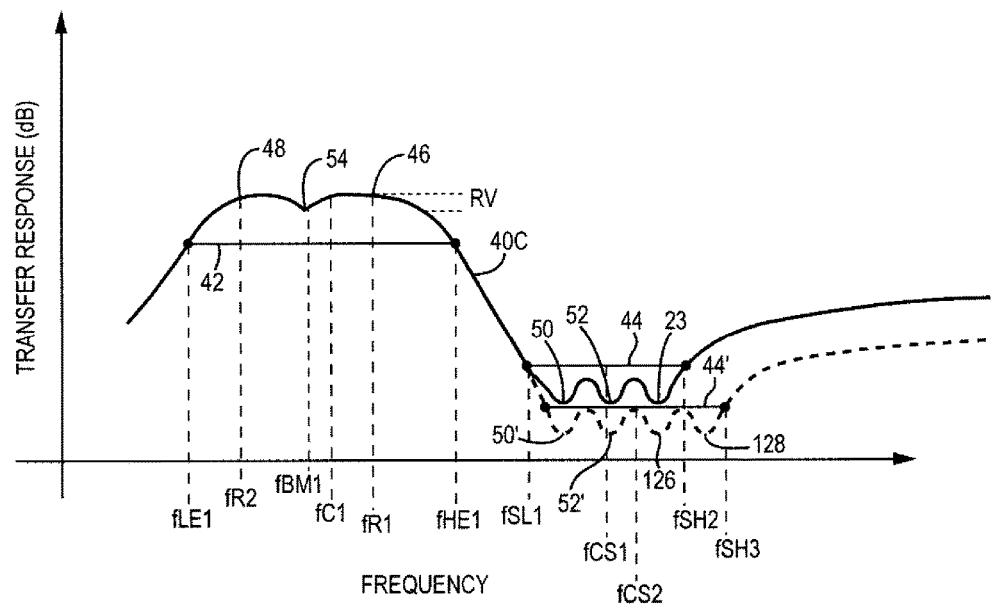
FIG. 9 illustrates one embodiment of the first transfer response of the RF filtering circuitry shown in FIG. 8.

Referring now to FIGS. 8 and 9, FIG. 9 illustrates one embodiment of a first transfer response 40C between the first port 12 and the second port 14. The first transfer response 40C defines an embodiment of the first passband 42 and the stopband 44. In FIG. 9, the stopband 44 is provided when the capacitive element 114 is included but the capacitive element 116 is not included. FIG. 9 also illustrates a stopband 44' adjacent to the first passband 42. This is the stopband 44' provided when both the capacitive element 114 and the capacitive element 116 are included. The first passband 42 of the first transfer response 40C has the center frequency fC1, the local maxima 46, and the local maxima 48. The first passband 42 is provided in the same manner described above with respect to FIGS. 5 and 6.

With regard to the stopband 44 that is provided when the capacitive element 116 is not included in the embodiment shown in FIG. 8, the stopband 44 of the first transfer response 40C is located adjacent to the first passband 42 of the first transfer response 40C due to the second RF filter path 18. The stopband 44 is also defined by taking a minimum or an average between local minima and finding the three dB points that are higher than the amplitude of the local minima or average local minima. In this embodiment, the stopband 44 is provided by an average between a local minima 50, a local minima 52, and local minima 126 and finding the three dB points that are higher than the average of the local minima 50, 52, 126. In this embodiment, the local minima 126 is a notch provided by the capacitive element 114. As such, the stopband 44 is wider than the stopband 44 shown in FIG. 6. A center frequency fCS1 is located at a center of the stopband 44. The high edge frequency of the stopband 44 is located at a frequency fSH2 since the first transfer response 40C is three dB higher than the average of the local minima 50, 52, 126 at the frequency fSH2. Note that the high edge frequency fSH2 shown in FIG. 9 is higher than the high edge frequency fSH1 shown in FIG. 6 since the stopband 44 in FIG. 8 has been expanded by the local minima 126 (i.e., the notch provided by the capacitive element 114). The low edge frequency of the stopband 44 is located at the frequency fSL1 since the first transfer response 40C is three dB higher than the average of the local minima 50, 52, 126 at the frequency fSL1. The stopband 44 of the first transfer response 40C is created by the second RF filter path 18, shown above with respect to FIG. 8. The stopband 44 is defined by the first transfer response 40C between the first port 12 and the second port 14. As shown, the second RF filter path 18 in FIG. 8 provides the stopband 44 adjacent to the first passband 42 without significantly increasing the ripple variation RV. Thus, the first passband 42 is relatively flat, and the ripple variation RV is relatively small. The stopband 44 is defined adjacent to the first passband 42 since the stopband 44 is provided by the roll-off in the first transfer response 40C from the first passband 42.

With regard to the stopband 44' that is provided when the capacitive element 116 is included in the embodiment shown in FIG. 8, the stopband 44' of the first transfer response 40C is located adjacent to the first passband 42 of the first transfer response 40C due to the second RF filter path 18. The stopband 44' is also defined by taking a minimum or an average between local minima and finding the three dB points that are higher than the amplitude of the local minima or average local minima. In this embodiment, the stopband 44' is provided by an average between a local minima 50', a local minima 52', a local minima 126', and the local minima 128 and finding the three dB points that are higher than the average of the local minima 50', 52', 126', 128. As previously discussed, with regard to the stopband 44 shown in FIG. 9, the local minima 126' in the stopband 44' is provided by the capacitive element 114.

Additionally, when the capacitive element 116 is provided, the capacitive element 116 provides yet another notch, which is the local minima 128 of the stopband 44'. As such, the stopband 44' is even wider than the stopband 44 shown in FIG. 9. A center frequency fCS2 is located at a center of the stopband 44'. The high edge frequency of the stopband 44' is located at a frequency fSH3 since the first transfer response 40C is three dB higher than the average of the local minima 50', 52', 126', 128 at the frequency fSH3. Note that the high edge frequency fSH3 shown in FIG. 9 is even higher than the high edge frequency fSH2 of the stopband 44, since the stopband 44' in FIG. 8 has been further expanded by the local minima 128 (i.e., the notch provided by the capacitive element 116). The low edge frequency of the stopband 44' is located at the frequency fSL1 since the first transfer response 40C is three dB higher than the average of the local minima 50', 52', 126', 128 at the frequency fSL1. The stopband 44' of the first transfer response 40C is created by the second RF filter path 18 shown above with respect to FIG. 8, when the capacitive element 116 is included. The stopband 44' is defined by the first transfer response 40C between the first port 12 and the second port 14. As shown, the second RF filter path 18 in FIG. 8 provides the stopband 44' adjacent to the first passband 42 without significantly increasing the ripple variation RV. Thus, the first passband 42 is relatively flat, and the ripple variation RV is relatively small. The stopband 44' is defined adjacent to the first passband 42 since the stopband 44' is provided by the roll-off in the first transfer response 40C from the first passband 42.

Figure 10:
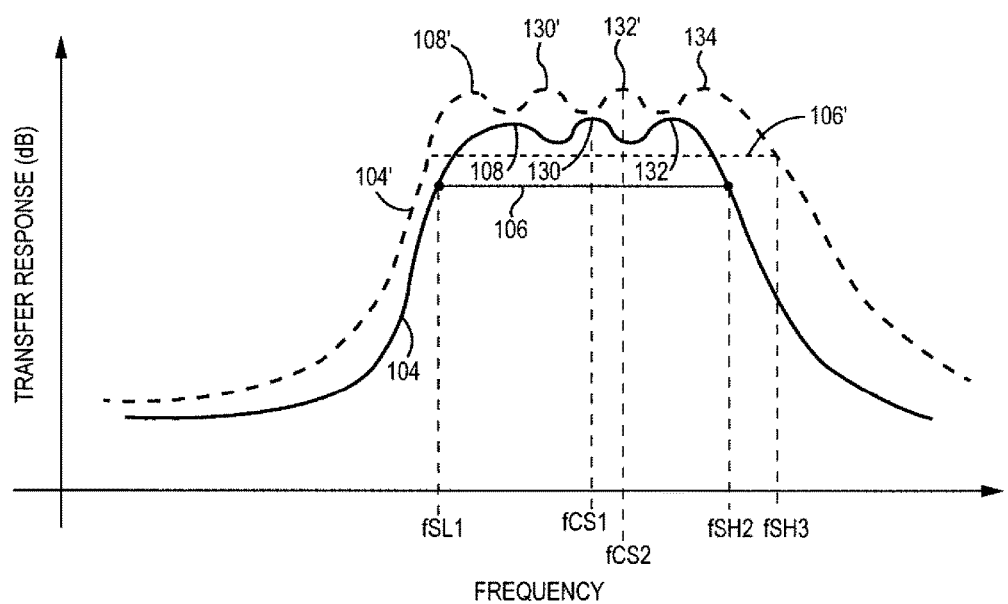
FIG. 10 illustrates one embodiment of the second transfer response of the RF filtering circuitry shown in FIG. 8.

Referring now to FIGS. 8 and 10, FIG. 10 illustrates an embodiment of the second transfer response 104 between the first port 12 and the third port 28 of the RF filtering circuitry 10C shown in FIG. 8. The second transfer response 104 shown in FIG. 10 is provided by the second RF filter path 18 when the capacitive element 116 is not included. In this embodiment, the second passband 106 of the second transfer response 104 has the center frequency fCS2, the local maxima 108, a local maxima 130, and a local maxima 132. The local maxima 108 is provided by the series resonator 86 and the parallel resonator 90 of the second RF filter path 18 wherein the series resonator 86 and the parallel resonator 90 are each configured to resonate at the frequency corresponding to the location of the local maxima 108. The local maxima 130 is provided by the parallel resonator 112 of the second RF filter path 18 wherein the parallel resonator 112 is configured to resonate at the frequency corresponding to the location of the local maxima 130. The second passband 106 also includes a local maxima 132. The local maxima 132 is provided by the capacitive element 114. As such, the local maxima 132 expands the second passband 106 and thus also expands the stopband 44 shown in FIG. 9. An average amplitude between the local maxima 108, the local maxima 130, and the local maxima 132 is determined. The high edge frequency fSH2 of the second passband 106 is at the location of the second transfer response 104 three dB lower than the average peak magnitude of the local maxima 108, the local maxima 130, and the local maxima 132. The low edge frequency fSL1 of the second passband 106 is at the location of the second transfer response 104; three dB lower than the average peak magnitude of the local maxima 108, the local maxima 130, and the local maxima 132. The second passband 106 shown in FIG. 10 provides the stopband 44 in the first transfer response 40C shown in FIG. 9. The high edge frequency fSH2 and the lower edge frequency fSL1 of the second passband 106 shown in FIG. 10 and the stopband 44 shown in FIG. 9 are the same. Thus, by expanding the second passband 106 with the capacitive element 114, the stopband 44 shown in FIG. 9 is also expanded.

Referring again to FIGS. 8 and 10, FIG. 10 illustrates an embodiment of the second transfer response 104' between the first port 12 and the third port 28 of the RF filtering circuitry 10C shown in FIG. 8. The second transfer response 104' shown in FIG. 10 is provided by the second RF filter path 18 when the capacitive element 116 is included. In this embodiment, the second passband 106' of the second transfer response 104' has the center frequency fCS3, the local maxima 108', the local maxima 130', the local maxima 132' and a local maxima 134. The local maxima 108' is provided by the series resonator 86 and the parallel resonator 90 of the second RF filter path 18 wherein the series resonator 86 and the parallel resonator 90 are each configured to resonate at the frequency corresponding to the location of the local maxima 108'. The local maxima 130' is provided by the parallel resonator 112 of the second RF filter path 18 wherein the parallel resonator 112 is configured to resonate at the frequency corresponding to the location of the local maxima 130'. The second passband 106' also includes the local maxima 132'. The local maxima 132' is provided by the capacitive element 114. As such, the local maxima 132' expands the second passband 106' and thus also expands the stopband 44' shown in FIG. 9. Additionally, the local maxima 134 is provided by the capacitive element 116. As such, the local maxima 134 further expands the second passband 106' and thus further expands the stopband 44' shown in FIG. 9. An average amplitude between the local maxima 108', the local maxima 130', the local maxima 132', and the local maxima 134 is determined. The high edge frequency fSH3 of the second passband 106' is at the location of the second transfer response 104'; three dB lower than the average peak magnitude of the local maxima 108', the local maxima 130', the local maxima 132', and the local maxima 134. The low edge frequency fSL1 of the second passband 106' is at the location of the second transfer response 104'; three dB lower than the average peak magnitude of the local maxima 108', the local maxima 130', the local maxima 132', and the local maxima 134'. The second passband 106' shown in FIG. 10 provides the stopband 44' in the first transfer response 40C shown in FIG. 9. The high edge frequency fSH3 and the lower edge frequency fSL1 of the second passband 106' shown in FIG. 10 and the stopband 44' shown in FIG. 9 are the same. Thus, by expanding the second passband 106' with the capacitive element 114 and the capacitive element 116, the stopband 44' shown in FIG. 9 is also expanded.

It should be noted that in alternative embodiments, any number of local maxima may be added to the second passband 106, 106' of the second transfer response 104, 104' using capacitive elements (like the capacitive elements 114, 116) and parallel resonators (like the parallel resonators 90, 112). In this manner, the stopbands 44, 44' can be expanded as needed by introducing significant ripple variation RV to the first passband 42 of the first transfer response 40C.

Figure 11:
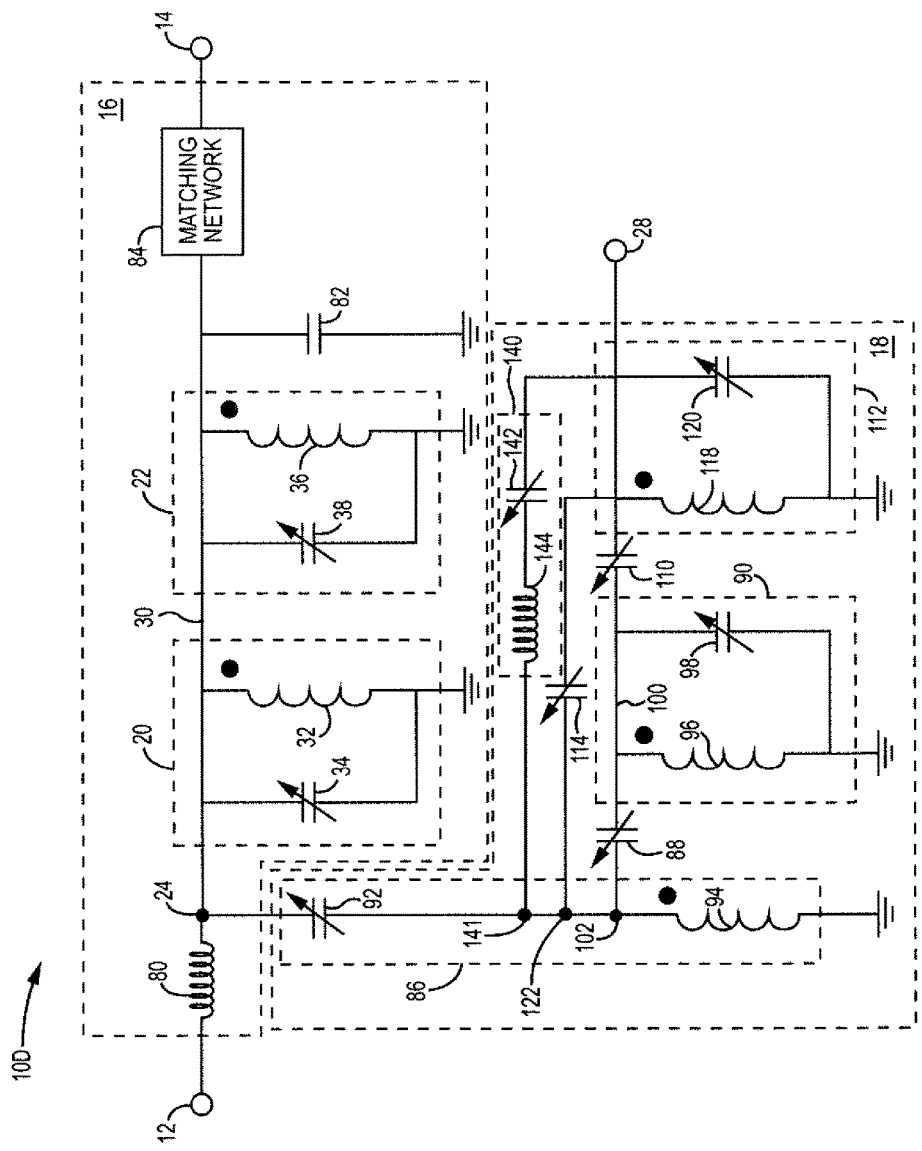
FIG. 11 illustrates another embodiment of the RF filtering circuitry shown in FIG. 1, which is similar to the embodiment shown in FIG. 5, but further includes a series resonator that provides a notch so as to expand the stopband.

Referring now to FIG. 11, FIG. 11 illustrates RF filtering circuitry 10D, which is another embodiment of the RF filtering circuitry 10 shown in FIG. 1. The RF filtering circuitry 10D includes the first port 12, the second port 14, the same embodiment of the first RF filter path 16 shown in FIG. 5, and another embodiment of the second RF filter path 18 shown in FIG. 1. As shown in FIG. 11, the second RF filter path 18 is coupled to the first RF filter path 16. In this embodiment, the second RF filter path 18 is connected between the first port 12 and the third port 28 by being connected between the connection node 24 and the third port 28. Thus, the second RF filter path 18 shown in FIG. 11 provides a filter path between the first port 12 and the third port 28. As in the embodiment shown in FIG. 1, the second RF filter path 18 shown in FIG. 11 is configured such that the first transfer response 40 between the first port 12 and the second port 14 defines the stopband 44 adjacent to the first passband without substantially increasing ripple variation within the first passband defined by the first transfer response 40.

Referring now to FIG. 11, FIG. 11 illustrates RF filtering circuitry 10D, which is another embodiment of the RF filtering circuitry 10 shown in FIG. 1. The RF filtering circuitry 10D includes the first port 12, the second port 14, the same embodiment of the first RF filter path 16 shown in FIG. 5, and another embodiment of the second RF filter path 18 shown in FIG. 1. As shown in FIG. 11, the second RF filter path 18 is coupled to the first RF filter path 16. In this embodiment, the second RF filter path 18 is connected between the first port 12 and the third port 28 by being connected between the connection node 24 and the third port 28. Thus, the second RF filter path 18 shown in FIG. 11 provides a filter path between the first port 12 and the third port 28. As in the embodiment shown in FIG. 1, the second RF filter path 18 shown in FIG. 11 is configured such that the first transfer response 40 between the first port 12 and the second port 14 defines the stopband 44 adjacent to the first passband without substantially increasing ripple variation within the first passband defined by the first transfer response 40.

In this embodiment, the second RF filter path 18 shown in FIG. 11 is configured so that the second transfer response 104 defines the second passband 106 that is adjacent to the first passband of the first transfer response 40. As such, RF signals within the second passband 106 propagate through the second RF filter path 18 between the first port 12 and the third port 28. Therefore, RF signals within the second passband 106 are prevented from propagating through the first RF filter path 16 between the first port 12 and the second port 14. Accordingly, the second RF filter path 18 defines the stopband 44 in the first transfer response 40 between the first port 12 and the second port 14 by defining the second passband 106 in the second transfer response 104 between the first port 12 and the third port 28. By defining the second passband 106 in the second transfer response 104 between the first port 12 and the third port 28, the second RF filter path 18 diverts RF signals within the second passband 106 and thus creates the stopband 44 within the first transfer response 40.

The second RF filter path 18 shown in FIG. 11 includes the series resonator 86, the capacitive element 88, the parallel resonator 90, the capacitive element 110, the parallel resonator 112, and the capacitive element 114 described above with respect to FIG. 8. Additionally, the second RF filter path 18 shown in FIG. 11 further includes a series resonator 140 connected between a connection node 141 and the parallel resonator 112. The connection node 141 is provided between the capacitive element 92 and the inductor 94 of the series resonator 86. The series resonator 140 is configured to sharpen roll-off out of the second passband 106 defined by the second transfer response 104 and thereby reduces flyback in the stopband 44 of the first transfer response 40. The series resonator 140 includes capacitive element 142 and an inductor 144 connected in series between the connection node 141 and the parallel resonator 112.

Figure 12:
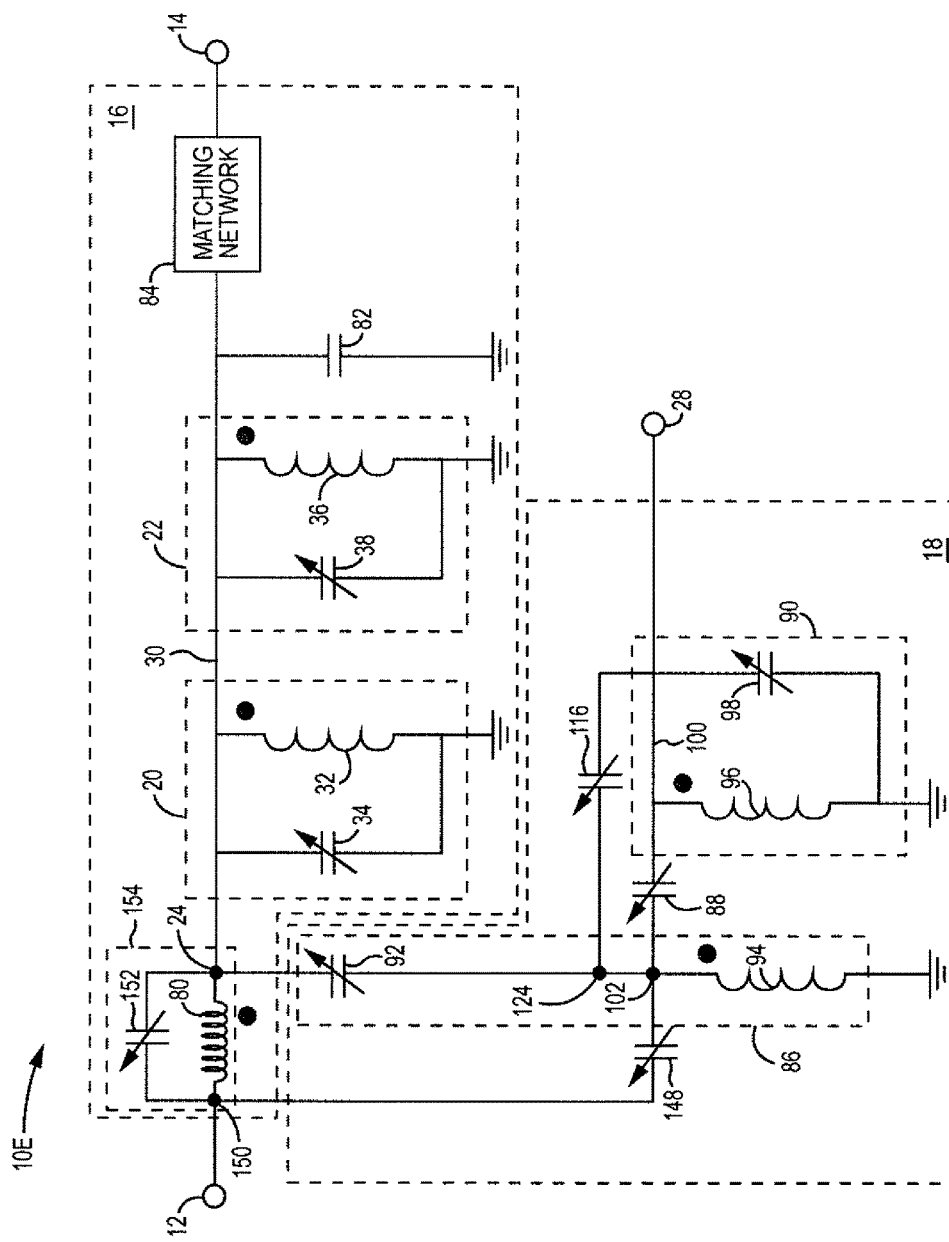
FIG. 12 illustrates another embodiment of the RF filtering circuitry shown in FIG. 1, which is similar to the embodiment shown in FIG. 5, but further includes a parallel resonator connected in series within the first RF filter path.

Referring now to FIG. 12, FIG. 12 illustrates RF filtering circuitry 10E, which is another embodiment of the RF filtering circuitry 10 shown in FIG. 1. The RF filtering circuitry 10E includes the first port 12, the second port 14, the same embodiment of the first RF filter path 16 shown in FIG. 5, and another embodiment of the second RF filter path 18 shown in FIG. 1. As shown in FIG. 12, the second RF filter path 18 is coupled to the first RF filter path 16. In this embodiment, the second RF filter path 18 is connected between the first port 12 and the third port 28 by being connected between the connection node 24 and the third port 28. Thus, the second RF filter path 18 shown in FIG. 12 provides a filter path between the first port 12 and the third port 28. As in the embodiment shown in FIG. 1, the second RF filter path 18 shown in FIG. 12 is configured such that the first transfer response 40 between the first port 12 and the second port 14 defines the stopband 44 adjacent to the first passband without substantially increasing ripple variation within the first passband defined by the first transfer response 40.

In this embodiment, the second RF filter path 18 shown in FIG. 12 is configured so that the second transfer response 104 defines the second passband 106 that is adjacent to the first passband of the first transfer response 40. As such, RF signals within the second passband 106 propagate through the second RF filter path 18 between the first port 12 and the third port 28. Therefore, RF signals within the second passband 106 are prevented from propagating through the first RF filter path 16 between the first port 12 and the second port 14. Accordingly, the second RF filter path 18 defines the stopband 44 in the first transfer response 40 between the first port 12 and the second port 14 by defining the second passband 106 in the second transfer response 104 between the first port 12 and the third port 28. By defining the second passband 106 in the second transfer response 104 between the first port 12 and the third port 28, the second RF filter path 18 diverts RF signals within the second passband 106 and thus creates the stopband 44 within the first transfer response 40.

The second RF filter path 18 shown in FIG. 12 includes the series resonator 86, the capacitive element 88, the parallel resonator 90 described above with respect to FIG. 5 along with the capacitive element 116 described above with respect to FIG. 8. Additionally, the second RF filter path 18 shown in FIG. 12 further includes a capacitive element 148 connected to the first RF filter path 16 at a connection node 150. The connection node 150 is provided at a first end of the inductor 80. The first end of the inductor 80 is an end of the inductor 80 closest to the first port 12. The connection node 24 is at a second end of the inductor 80 wherein the second end of the inductor 80 is oppositely disposed from the first end. The capacitive element 148 is thus connected between the connection node 150 and the connection node 120.

As explained above, the inductor 80 is connected in series within the main branch 30 of the first RF filter path 16 between the first port 12 and the parallel resonator 20. The first RF filter path 16 shown in FIG. 12 includes a capacitive element 152 connected in parallel with respect to the inductor 80. In this embodiment, the capacitive element 152 is connected from the connection node 150 to the connection node 24. Accordingly, the capacitive element 152 is connected in parallel with respect to the inductor 80 so that the capacitive element 152 and the inductor 80 form a parallel resonator 154. The parallel resonator 154 is connected in series within the first RF filter path 16 between the first port 12 and the parallel resonator 20. The parallel resonator 154 is configured to resonate and thereby provide a notch within the stopband 44 that is adjacent to the first passband defined by the first transfer function between the first port 12 and the second port 14.

The parallel resonator 154 is weakly coupled to the series resonator 86 within the second RF filter path 18 shown in FIG. 12. Since, as explained above with respect to FIG. 5, the series resonator 86 is weakly coupled to the parallel resonator 90, the parallel resonator 154 and the parallel resonator 90 are also weakly coupled. In this embodiment, the weak coupling between the parallel resonator 154 and the series resonator 86 may be provided through magnetic coupling and/or electric coupling. For example, the inductor 80 of the parallel resonator 154 is magnetically coupled to the inductor 94 of the series resonator 86. In addition, the capacitive element 148 is provided in series within the first RF filter path 16 so as to electrically couple the parallel resonator 154 to the series resonator 86. It should be noted that in alternative embodiments, the weak coupling between the parallel resonator 154 and the series resonator 86 may be provided only through magnetic coupling and thus the capacitive element 148 would not be provided. In other alternative embodiments, the weak coupling between the parallel resonator 154 and the series resonator 86 is provided through capacitive electrocoupling, and thus the inductor 80 and the inductor 94 in these embodiments would not be magnetically coupled.

The second transfer response 104 of the RF filtering circuitry 10E between the first port 12 and the third port 28 provides the second passband 106 thereby providing the stopband 44 adjacent to the first passband in the first filter response between the first port 12 and the third port 28. By providing weak coupling between the series resonator 86, the parallel resonator 90, and the parallel resonator 154, the second RF filter path 18 presents low loading to the first RF filter path 16 within the first passband. As such, the second RF filter path 18 shown in FIG. 12 does not introduce significant ripple variation in the first passband of the first transfer response 40 but does provide the stopband 44 is provided adjacent to the first passband.

Those skilled in the art will recognize improvements and modifications to the preferred embodiments of the present disclosure. All such improvements and modifications are considered within the scope of the concepts disclosed herein and the claims that follow.

What is claimed is:

1. Radio frequency (RF) filtering circuitry comprising:
   a first port;
   a second port;
   a first RF filter path connected between the first port and the second port, wherein the first RF filter path comprises:
      at least a pair of weakly coupled resonators that are configured such that a first transfer response between the first port and the second port defines a first passband; and
      a first capacitive element coupled between the first port and the pair of weakly coupled resonators; and
   a second RF filter path coupled to the first RF filter path, comprising a second capacitive element coupled between the first port and a parallel resonator, a second capacitance of the second capacitive element being at least one order of magnitude smaller than a first capacitance of the first capacitive element;
   wherein the second RF filter path is configured such that the first transfer response between the first port and the second port defines a stopband adjacent to the first passband without substantially increasing ripple variation of the first passband defined by the first transfer response.

2. The RF filtering circuitry of claim 1 wherein the second RF filter path is configured to reduce flyback of the first transfer response in the stopband.

3. The RF filtering circuitry of claim 1 wherein the second RF filter path is configured so that the stopband increases roll-off of the first transfer response in the first passband.

4. The RF filtering circuitry of claim 1 wherein the second RF filter path is configured so that the stopband increases a shape factor of the first transfer response in the first passband.

5. The RF filtering circuitry of claim 1 wherein the second RF filter path is connected between the first port and the second port so that the second RF filter path is in parallel with respect to the first RF filter path.

6. The RF filtering circuitry of claim 5 wherein the second RF filter path is configured to dissipate RF signals within the stopband of the first transfer response.

7. The RF filtering circuitry of claim 1, wherein a first resonator of the pair of weakly coupled resonators comprises a variable capacitance for tuning the first passband.

8. Radio frequency (RF) filtering circuitry comprising:
   a first port;
   a second port;
   a third port;
   a first RF filter path connected between the first port and the second port, wherein the first RF filter path comprises at least a pair of weakly coupled resonators that are configured such that a first transfer response between the first port and the second port defines a first passband; and
   a second RF filter path coupled to the first RF filter path and connected between the first RF filter path and the third port;
   wherein:
      the second RF filter path is configured such that the first transfer response between the first port and the second port defines a stopband adjacent to the first passband without substantially increasing ripple variation of the first passband defined by the first transfer response;
      the second RF filter path is configured to provide a second passband defined by a second transfer response between the first port and the third port; and
      the second passband defined by the second transfer response is adjacent to the first passband defined by the first transfer response such that the second passband of the second transfer response creates the stopband defined by the first transfer response.

9. The RF filtering circuitry of claim 8 wherein the second RF filter path is configured to reduce flyback of the first transfer response in the stopband.

10. The RF filtering circuitry of claim 8 wherein the second RF filter path is configured so that the stopband increases roll-off of the first transfer response in the first passband.

11. The RF filtering circuitry of claim 8 wherein the second RF filter path is configured so that the stopband increases a shape factor of the first transfer response in the first passband.

12. The RF filtering circuitry of claim 8 wherein the second RF filter path is connected between the first port and the second port so that the second RF filter path is in parallel with respect to the first RF filter path.

13. The RF filtering circuitry of claim 12 wherein the second RF filter path is configured to dissipate RF signals within the stopband of the first transfer response.

* * * * *